US008564046B2

(12) United States Patent
Kim et al.

(10) Patent No.: US 8,564,046 B2
(45) Date of Patent: Oct. 22, 2013

(54) VERTICAL SEMICONDUCTOR DEVICES

(75) Inventors: Jin-Gyun Kim, Yongin-si (KR); Myoung-Bum Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 205 days.

(21) Appl. No.: 13/104,377

(22) Filed: May 10, 2011

(65) Prior Publication Data

US 2011/0303970 A1  Dec. 15, 2011

(30) Foreign Application Priority Data

Jun. 15, 2010  (KR) .................. 10-2010-0056286

(51) Int. Cl.
H01L 29/792 (2006.01)

(52) U.S. Cl.
USPC ............ 257/324; 257/329; 438/156; 438/268

(58) Field of Classification Search
USPC ........... 257/314, 315, 324, 329; 438/156, 268
See application file for complete search history.

(56) References Cited

U.S. PATENT DOCUMENTS

| 7,382,018 | B2 | 6/2008 | Kim et al. | |
|---|---|---|---|---|
| 7,662,720 | B2 | 2/2010 | Kim et al. | |
| 2004/0152334 | A1 | 8/2004 | Ohto et al. | |
| 2006/0186446 | A1 | 8/2006 | Kim et al. | |
| 2008/0173928 | A1 | 7/2008 | Arai et al. | |
| 2008/0180994 | A1* | 7/2008 | Katsumata et al. | 365/174 |
| 2008/0242025 | A1 | 10/2008 | Kim et al. | |
| 2009/0090960 | A1* | 4/2009 | Izumi et al. | 257/324 |
| 2009/0230450 | A1 | 9/2009 | Shiino et al. | |
| 2009/0230459 | A1* | 9/2009 | Kito et al. | 257/324 |
| 2009/0242966 | A1 | 10/2009 | Son et al. | |
| 2009/0286402 | A1 | 11/2009 | Xia et al. | |
| 2010/0109071 | A1* | 5/2010 | Tanaka et al. | 257/324 |
| 2011/0024818 | A1* | 2/2011 | Ahn | 257/314 |
| 2011/0269290 | A1 | 11/2011 | Kasahara et al. | |
| 2011/0306195 | A1 | 12/2011 | Kim et al. | |
| 2012/0146122 | A1* | 6/2012 | Whang et al. | 257/315 |

FOREIGN PATENT DOCUMENTS

| JP | 2005-93808 | 4/2005 |
|---|---|---|
| JP | 2009-146942 | 7/2009 |
| JP | 2009158775 | 7/2009 |
| JP | 2009224574 | 10/2009 |
| KR | 10-2006-0089547 | 8/2006 |
| KR | 1020090093770 | 9/2009 |
| KR | 10-2011-0136273 | 12/2011 |

OTHER PUBLICATIONS

Walker, Perrin, et al., "Handbook of Metal Etchants," 1991, pp. 187-189, CRC Press LLC.

* cited by examiner

*Primary Examiner* — Kimberly Rizkallah
*Assistant Examiner* — Errol Fernandes
(74) *Attorney, Agent, or Firm* — Onello & Mello, LLP

(57) ABSTRACT

A vertical semiconductor device and a method of making a vertical semiconductor device include a first semiconductor pattern formed on a substrate and a first gate structure formed on a sidewall of the first semiconductor pattern. A second semiconductor pattern is formed on the first semiconductor pattern. A plurality of insulating interlayer patterns is formed on sidewalls of the second semiconductor pattern. The insulating interlayer patterns are spaced apart from each other to define grooves between the insulating interlayer patterns. The plurality of second gate structures is disposed in the grooves, respectively.

15 Claims, 31 Drawing Sheets

VERTICAL SEMICONDUCTOR DEVICES

CROSS-REFERENCE TO RELATED APPLICATIONS

This application claims priority under 35 USC §119 to Korean Patent Application No. 10-2010-0056286 filed on Jun. 15, 2010 in the Korean Intellectual Property Office (KIPO), the contents of which are herein incorporated by reference in their entirety.

BACKGROUND

1. Field

Exemplary embodiments relate to vertical semiconductor devices and methods of manufacturing vertical semiconductor devices. More particularly, exemplary embodiments relate to non-volatile memory devices which include a vertical channel and methods of manufacturing non-volatile memory devices which include a vertical channel.

2. Description of the Related Art

Recently, methods of manufacturing multiple transistors in a vertical direction with respect to a substrate, instead of or in addition to a horizontal direction, have been developed to improve the integration degree of memory devices. According to these methods, sacrificial layers and insulation layers are alternately and repeatedly stacked and partially etched to form an opening for forming the transistors. A potential drawback to these methods is that, as the number of the stacked layers increases, it becomes increasingly difficult to form the opening with a small width. It may also be difficult to form a layer or pattern filling the opening when the opening has a high aspect ratio.

SUMMARY

Exemplary embodiments provide a vertical semiconductor device having a reduced height.

Exemplary embodiments provide a method of manufacturing a vertical semiconductor device having a reduced height.

According to one aspect, the inventive concept is directed to a vertical semiconductor device, which includes a substrate and a first semiconductor pattern disposed on the substrate. A first gate structure is disposed on a sidewall of the first semiconductor pattern. A second semiconductor pattern is disposed on the first semiconductor pattern. A plurality of insulating interlayer patterns is disposed on sidewalls of the second semiconductor pattern. The insulating interlayer patterns are spaced apart from each other to define grooves between the insulating interlayer patterns. A plurality of second gate structures is disposed in the grooves, respectively.

In exemplary embodiments, the first gate structure includes a first conductive material, the second gates structures include a second conductive material, and the first and second conductive materials are different materials.

In exemplary embodiments, the first gate structure may have a height that is different from a height of at least one of the second gate structures.

In exemplary embodiments, the first gate structure may include a gate insulation layer and a first conductive layer pattern that are sequentially stacked. The first gate structure may serve as a ground selection line (GSL).

In exemplary embodiments, the first conductive layer pattern may include polysilicon.

In exemplary embodiments, each of the second gate structures may include a tunnel insulation layer, a charge trapping layer, a blocking dielectric layer and a second conductive layer pattern which are sequentially stacked. The second gate structures may serve as word lines of cell transistors and string selection lines (SSLs) of string selection transistors (SSTs). The SSTs may be over the cell transistors and may include at least two transistors.

In exemplary embodiments, the second conductive layer pattern may include a metal.

In exemplary embodiments, an impurity region is disposed at an upper portion of the substrate between a plurality of the first gate structures. The impurity region may serve as a common source line (CSL).

In exemplary embodiments, the vertical semiconductor device may further include a metal silicide pattern and/or a metal layer on the impurity region.

According to another aspect, the inventive concept is directed to a vertical semiconductor device. The device includes a first semiconductor pattern on a substrate. A first gate structure is disposed on a sidewall of the first semiconductor pattern, the first gate structure including a gate insulation layer and a first conductive layer pattern which are sequentially stacked, the first gate structure serving as a ground selection line (GSL). A second semiconductor pattern is disposed on the first semiconductor pattern. A plurality of insulating interlayer patterns is disposed on sidewalls of the second semiconductor pattern, the insulating interlayer patterns being spaced apart to define grooves between the insulating interlayer patterns. A plurality of second gate structures is disposed in the grooves, respectively, each of the second gate structures including a tunnel insulation layer, a charge trapping layer, a blocking dielectric layer and a second conductive layer pattern which are sequentially stacked, the second gate structures serving as word lines of cell transistors and string selection lines (SSLs) of string selection transistors (SSTs), the SSTs being disposed over the cell transistors and including at least two transistors. An impurity region is disposed at an upper portion of the substrate, the impurity region serving as a common source line (CSL).

In exemplary embodiments, the first gate structure has a different height from that of the second gate structures.

In exemplary embodiments, a conductive material of the first gate structure is different from that of the second gate structures.

In exemplary embodiments, the first conductive layer pattern comprises polysilicon.

In exemplary embodiments, the second conductive layer pattern comprises a metal.

In exemplary embodiments, the device further comprises a conductive material layer formed on the impurity region.

According to another aspect, the inventive concept is directed to a method of manufacturing a vertical semiconductor device. In the method, a first semiconductor pattern may be formed on a substrate. A first gate structure may be formed on a sidewall of the first semiconductor pattern. A plurality of sacrificial layers and a plurality of insulation interlayers may be repeatedly and alternately formed on the first semiconductor pattern and the first gate structure. A second semiconductor pattern may be formed through the plurality of sacrificial layers and the plurality of insulating interlayers. The second semiconductor pattern may contact a top surface of the first semiconductor pattern. The insulating interlayers and the sacrificial layers may be partially removed to form insulating interlayer patterns and sacrificial layer patterns on a sidewall of the second semiconductor pattern. The sacrificial layer patterns may be removed to form a plurality of grooves between the insulating interlayer patterns. A plurality of second gate structures may be formed in the grooves, respectively.

In exemplary embodiments, in forming the first semiconductor pattern and the first gate structure, a pad insulation layer, a first conductive layer and a buffer layer may be sequentially formed on the substrate. The buffer layer, the first conductive layer and the pad insulation layer are partially removed to form a first opening through the buffer layer, the first conductive layer and the pad insulation layer. The first opening may expose a top surface of the substrate. A gate insulation layer may be formed on a sidewall of the first opening. A first semiconductor pattern may be formed on the exposed top surface of the substrate to fill the opening. The buffer layer, the first conductive layer and the pad insulation layer may be partially removed to form a second opening and a first conductive layer pattern. The second opening may expose a top surface of the substrate.

In exemplary embodiments, impurities may be implanted at an upper portion of the substrate exposed by the second opening to form a common source line (CSL).

In exemplary embodiments, a metal silicide pattern may be further formed at an upper portion of the substrate exposed by the second opening and at a sidewall of the first conductive layer pattern exposed by the second opening.

In exemplary embodiments, the metal silicide pattern may include tungsten silicide, cobalt silicide and/or nickel silicide.

In exemplary embodiments, an insulation layer pattern may be further formed on a sidewall of the second opening. A third conductive layer pattern may be further formed to fill the second opening.

In exemplary embodiments, the third conductive layer pattern may include a metal.

In exemplary embodiments, the first conductive layer may include polysilicon.

In exemplary embodiments, the second gate structure may include a tunnel insulation layer, a charge trapping layer, a blocking dielectric layer and a second conductive layer pattern. The second conductive layer pattern may include a metal.

In exemplary embodiments, in forming the second semiconductor pattern, the insulating interlayers and the sacrificial layers may be partially removed to form a third opening through the insulating interlayers and the sacrificial layers. The third opening may expose the top surface of the first semiconductor pattern. A semiconductor layer may be formed on the exposed top surface of the first semiconductor pattern to fill the opening.

According to exemplary embodiments, the vertical semiconductor device may include a ground selection transistor and a first semiconductor pattern in a lowermost level of the stacked vertical structure. Cell and string selection transistors and a second semiconductor pattern may be formed after forming the ground selection transistor and the first semiconductor pattern. The second semiconductor pattern may be formed on the first semiconductor pattern. Thus, the number of layers required to be etched to form the second semiconductor pattern may be decreased so that the second semiconductor pattern may be formed reliably and without substantial difficulty. Further, an opening for separating word lines from each other in each level may have a low aspect ratio so that the word lines may be readily formed.

BRIEF DESCRIPTION OF THE DRAWINGS

The foregoing and other features and advantages of the inventive concept will be apparent from the detailed description of preferred embodiments of the inventive concept contained herein, as illustrated in the accompanying drawings, in which like reference characters refer to the same parts or elements throughout the different views. The drawings are not necessarily to scale, emphasis instead being placed upon illustrating the principles of the inventive concept. In the drawings, the thickness of layers and regions may be exaggerated for clarity.

FIGS. 3A to 3K are schematic cross-sectional views illustrating a method of manufacturing the vertical semiconductor device of FIGS. 1 and 2, in accordance with exemplary embodiments of the inventive concept.

DETAILED DESCRIPTION OF THE EMBODIMENTS

Figure 1:
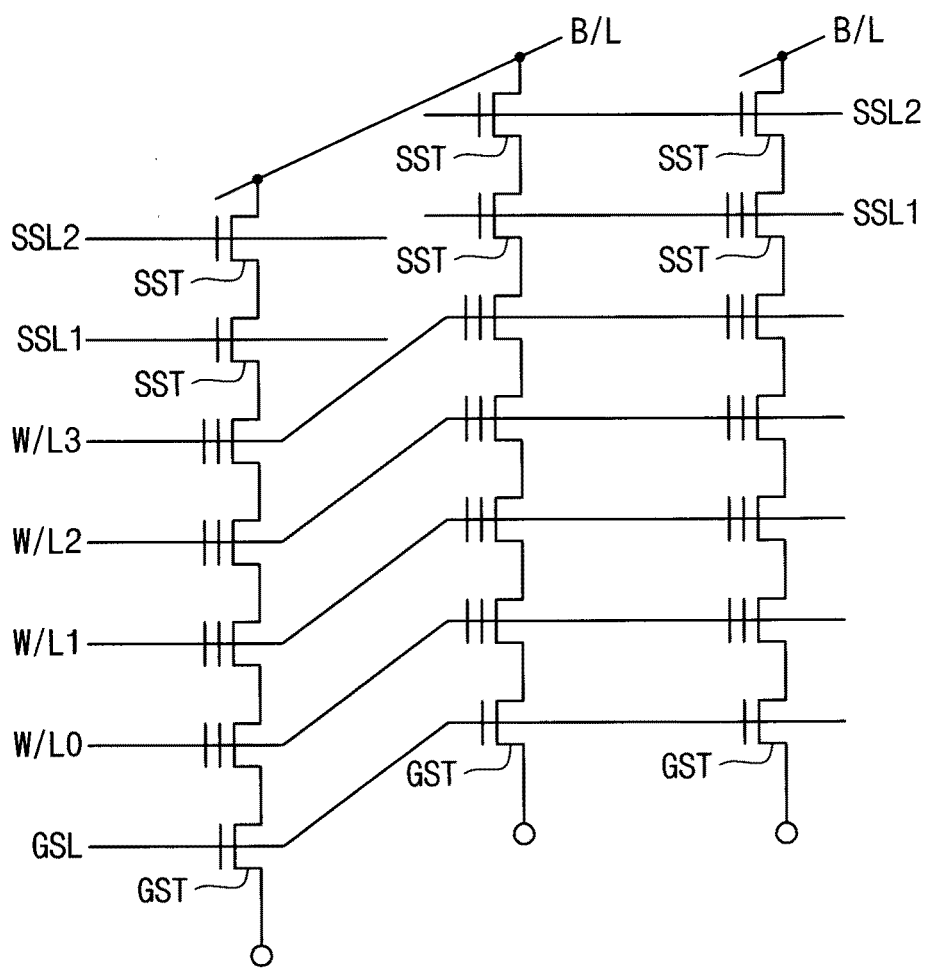
FIG. 1 is a schematic circuit diagram illustrating a vertical semiconductor device, in accordance with exemplary embodiments of the inventive concept.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this description will be thorough and complete, and will fully convey the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be described in detail with reference to the accompanying drawings.

FIG. 1 is a schematic circuit diagram illustrating a vertical semiconductor device in accordance with some exemplary embodiments of the inventive concept.

Referring to FIG. 1, the vertical semiconductor device 10 may include a plurality of strings. Each of the strings may have a plurality of memory cells stacked in a vertical direction relative to a substrate. Each of the strings may include cell transistors and selection transistors connected to each other in series.

According to some exemplary embodiments, each of the cell transistors may include a tunnel insulation layer pattern, a charge trapping layer pattern, a dielectric layer pattern and a control gate electrode. The control gate electrodes of the cell transistors may serve as word lines W/L0 to W/L3, as illustrated in FIG. 1. The cell transistors may be connected to each other in series in the vertical direction. A ground selection transistor (GST) and string selection transistors (SST) may be formed at ends of each string. A gate electrode of the GST may serve as a ground selection line (GSL), and a gate electrode of the SST may serve as a string selection line (SSL).

In some exemplary embodiments, the GST may include one transistor. The one transistor may have a gate length which is greater than that of the cell transistor.

The SSTs may include two or more transistors connected to each other in series. In the illustrative exemplary embodiment of FIG. 1, each string includes two SSTs. Each of the SSTs may have a gate length substantially the same as or similar to that of the cell transistor. In some particular exemplary embodiments, a difference between the gate lengths of the SST and the cell transistor may be less than about 10% of the greater of the gate lengths of the SST and the cell transistor.

A common source line (CSL) may be connected to the GST.

The word lines at the same level may be electrically connected to each other.

Figure 2A:
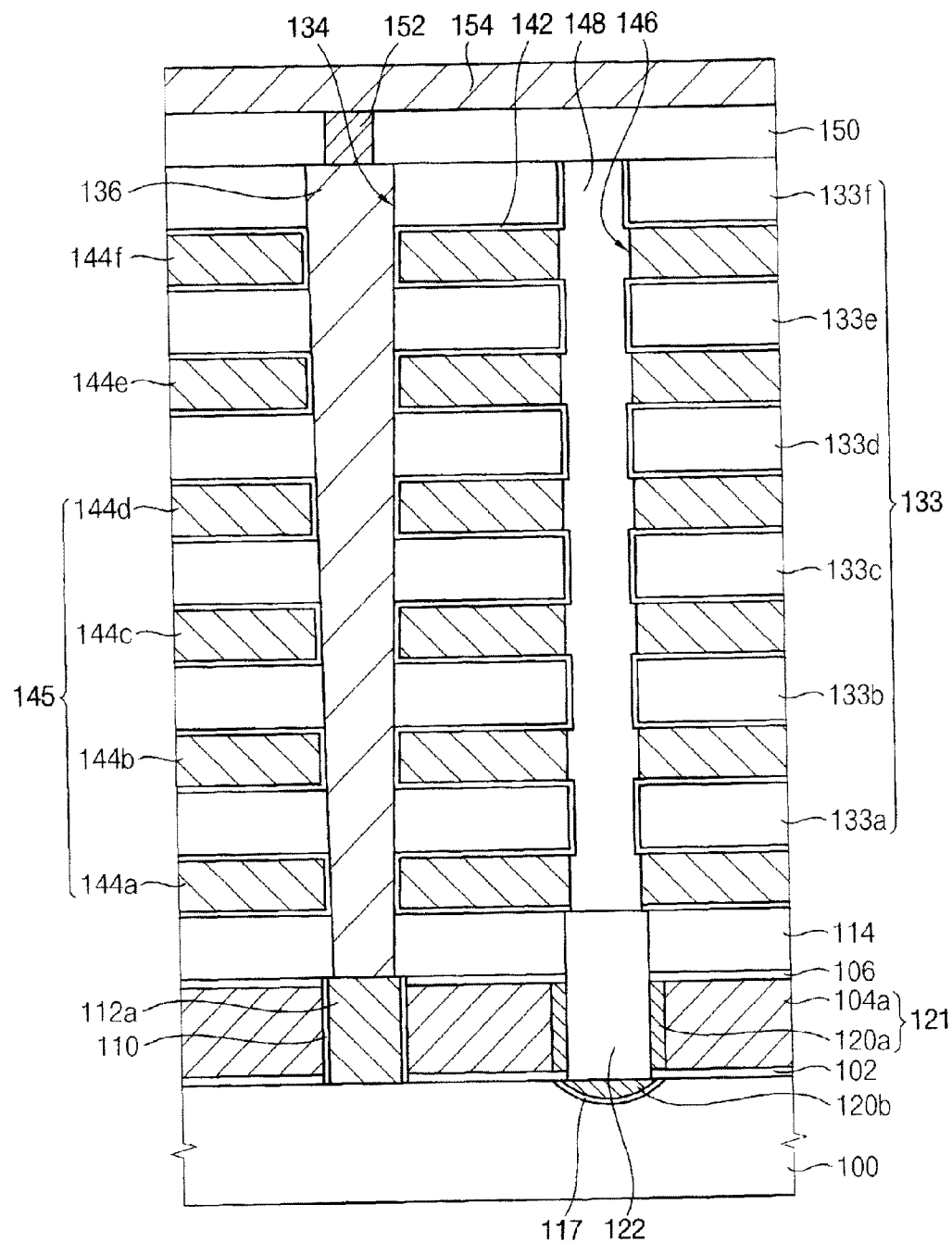
FIGS. 2A and 2B are a schematic cross-sectional view and a schematic perspective view, respectively, illustrating a vertical semiconductor device, in accordance with exemplary embodiments of the inventive concept.
Figure 2B:
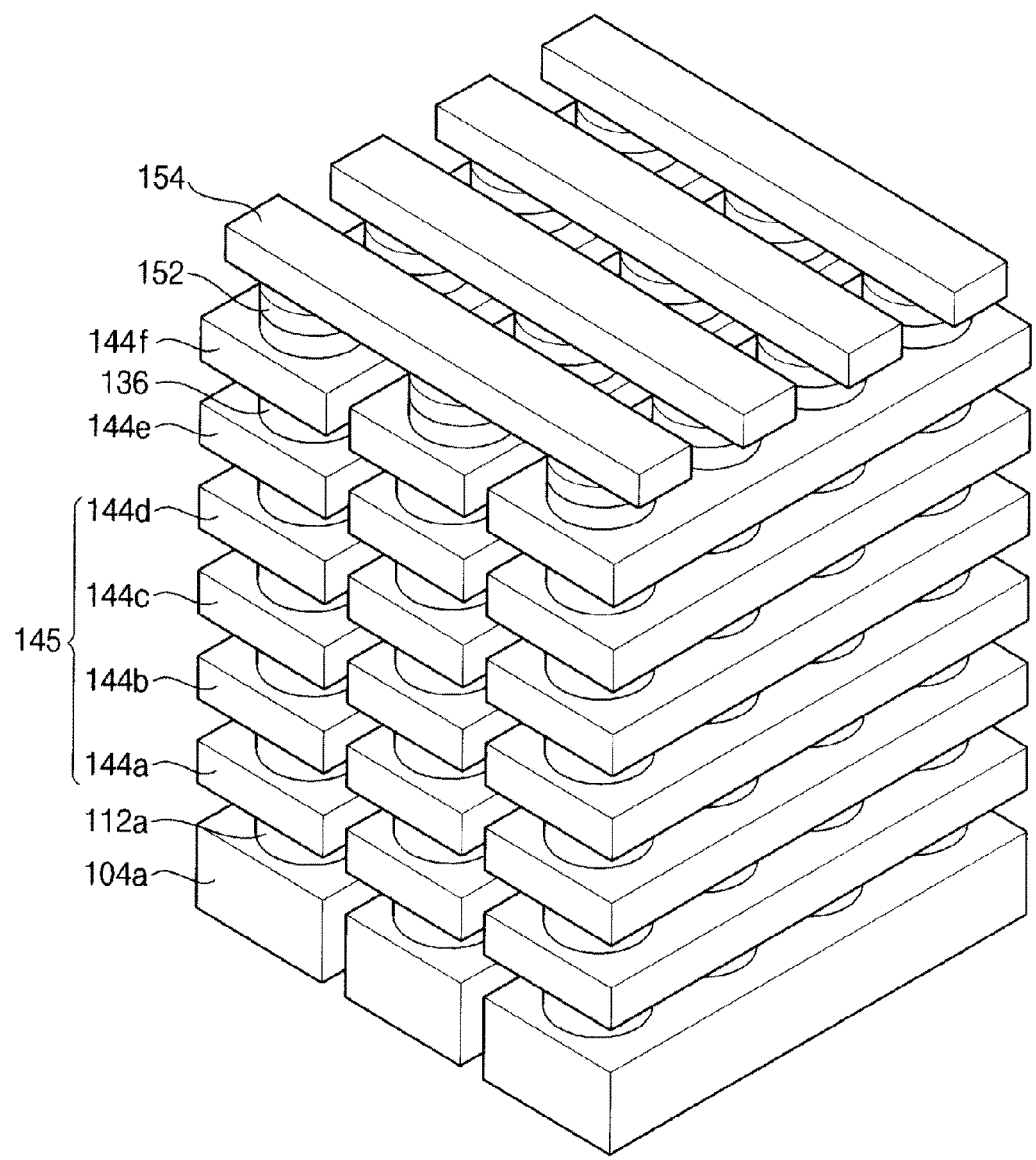

FIGS. 2A and 2B are a schematic cross-sectional view and a schematic perspective view, respectively, illustrating a vertical semiconductor device in accordance with exemplary embodiments. The circuit illustrated in FIG. 1 may be implemented as shown in FIGS. 2A and 2B. Hereinafter, a first direction referred to herein and illustrated in the drawings may be a direction in which the word line extends, and a second direction referred to herein may be a direction in which a bit line extends. A third direction referred to herein may be a direction that is vertical to a top surface of the substrate.

Referring to FIGS. 2A and 2B, a first semiconductor pattern 112a may be disposed on a substrate 100 to protrude or extend in the third direction from the substrate 100. According to embodiments of the inventive concept, the first semiconductor pattern 112a may serve as a channel region of a GST. In some exemplary embodiments, the first semiconductor pattern 112a may be or include single crystalline silicon and/or polysilicon. In the present exemplary embodiment, the first semiconductor pattern 112a may include polysilicon. In some exemplary embodiments, as illustrated in FIGS. 2A and 2B, the first semiconductor pattern 112a may have, for example, a solid cylindrical shape, i.e., a pillar shape. The first semiconductor pattern 112a may be doped with impurities, for example, p-type impurities.

The GST may be formed on the substrate 100 and may extend in the first direction.

Specifically, a first gate insulation layer 110 may be formed on the substrate 100 to at least partially surround a sidewall of the first semiconductor pattern 112a. In some exemplary embodiments, the first gate insulation layer 110 may include, for example, silicon oxide. Alternatively, in some exemplary embodiments, the first gate insulation layer 110 may have a multi-stacked structure of a plurality of insulating materials which, in some exemplary embodiments, include silicon oxide, silicon nitride and silicon oxide. A first gate electrode 121 at least partially surrounding the first gate insulation layer 110 may be formed on a pad insulation layer 102, which is formed on the substrate 100. The first gate electrode 121 may have a linear shape extending in the first direction.

The first gate electrode 121 may make contact with both the first gate insulation layer 110 and the pad insulation layer 102. In some exemplary embodiments, the GST may have a three-dimensional structure in which the channel regions may be formed both in the first semiconductor pattern 112a contacting the first gate insulation layer 110 and at an upper portion of the substrate 100 below the pad insulation layer 102. The thicknesses of the first gate insulation layer 110 and the pad insulation layer 102 can be selected based on desired characteristics of the resulting GST. That is, in some exemplary embodiments, operation characteristics of the GST may be changed by adjusting one or more of the thicknesses of the first gate insulation layer 110 and the pad insulation layer 102. Further, since the channel regions of the GST may be formed both in the first semiconductor pattern 112a and the first gate insulation layer 110, the single GST may operate as two GSTs. In some exemplary embodiments, the first semiconductor pattern 112a and the first gate electrode 121 may have top surfaces coplanar with each other.

In some exemplary embodiments, the first gate electrode 121 may include polysilicon. The first gate electrode 121 may include a conductive layer pattern 104a at least partially surrounding the first gate insulation layer 110 and a metal silicide pattern 120a at a sidewall of the conductive layer pattern 104a. The metal silicide pattern 120a may reduce resistance of the first gate electrode 121. To that end, in some exemplary embodiments, the metal silicide pattern 120a may be formed of and/or include tungsten silicide, cobalt silicide, nickel silicide, or other similar material.

Alternatively, in some exemplary embodiments, the first gate electrode 121 may include a metal which can be, for example, tungsten (W).

A first insulation layer pattern 122 may be disposed between the first gate electrodes 121 that face each other. Specifically, in some exemplary embodiments, the first insulation layer pattern 122 may be disposed between the metal silicide patterns 120a of the first gate electrodes 121. In some exemplary embodiments, the first insulation layer pattern 122 may include and/or be made of silicon oxide. The first insulation layer pattern 122 may have a linear shape extending in the first direction.

A second semiconductor pattern 136 may be disposed on the top surface of the first semiconductor pattern 112a to protrude or extend from the top surface of the first semiconductor pattern 112a in the third direction. In some exemplary embodiments, the second semiconductor pattern may 136 have a solid substantially cylindrical shape, i.e., a pillar shape. The second semiconductor pattern 136 may be substantially cylindrical in shape, but may also have a slight taper, as shown in the figures, due to manufacturing. The second semiconductor pattern 136 may include and/or be made of single crystalline silicon and/or polysilicon. In some exemplary embodiments, the second semiconductor pattern 136 may be formed using a material substantially the same as that of the first semiconductor pattern 112a. In the present exemplary embodiment, the second semiconductor pattern 136 may include polysilicon.

Cell transistors which form a string may be disposed on a sidewall of the second semiconductor pattern 136. The cell transistors may be connected to each other in series. In some exemplary embodiments, two SSTs may be disposed on an upper portion of the sidewall of the second semiconductor pattern 136. In some exemplary embodiments, each of the SSTs may have a gate length substantially the same as that of the cell transistor. Alternatively, in some exemplary embodiments, a difference between the gate lengths of the SST and the cell transistor may be less than about 10% of the greater of the gate length of the SST and the gate length of the cell transistor. In some exemplary embodiments, the SST may have a structure substantially the same as that of the cell transistor except that, in the cell transistor, a multi-layered structure including a tunnel insulation layer, a charge trapping layer and a blocking layer may be formed instead of the gate insulation layer of the SST.

The vertical semiconductor device may also include insulating interlayer patterns 133 disposed between control gate electrodes 145 and second gate electrodes 144e and 144f. The insulating interlayer patterns 133 insulate the gate electrodes 145, 144e and 144f from each other. In some exemplary embodiments, the insulating interlayer patterns 133 may have a linear shape at least partially surrounding the sidewall of the second semiconductor pattern 136 and extending in the first direction.

The insulating interlayer patterns 133 may be parallel to one another at a plurality of levels and may protrude or extend from the sidewall of the second semiconductor pattern 136. The insulating interlayer patterns 133 may have a linear shape extending in the first direction and may be spaced apart from each other in the third direction. Grooves may be formed between the insulating interlayer patterns 133. The grooves are formed to expose the sidewall of the semiconductor pattern 136. Gate structures may be formed in respective grooves.

In some exemplary embodiments, a tunnel insulation layer may be formed on one or more portions of the sidewall of the second semiconductor pattern 136 exposed by the grooves. The tunnel insulation layer may be formed on the sidewall of the second semiconductor pattern 136 and surfaces of the insulating interlayer patterns 133. As a result, the tunnel insulation layer may be continuously connected throughout all levels. Alternatively, in some exemplary embodiments, a plurality of tunnel insulation layers separated from each other in the levels may be formed.

In some exemplary embodiments, a charge trapping layer may be formed on the tunnel insulation layer. The charge trapping layer may include or be made of, for example, silicon nitride or a metal oxide in which electrons may be trapped. Like the tunnel insulation layer, the charge trapping layer may be formed continuously throughout all levels or separated from each other according to or at the levels.

In some exemplary embodiments, a blocking dielectric layer may be formed on the charge trapping layer. The blocking dielectric layer may include or be made of, for example, silicon oxide or a metal oxide. The metal oxide may be or include aluminum oxide.

In FIG. 2A, the tunnel insulation layer, the charge trapping layer and the blocking dielectric layer are illustrated as a single layer 142. The illustration of the single layer 142 is intended to include embodiments which include the tunnel insulation layer, the charge trapping layer and the blocking dielectric layer as described above.

The control gate electrodes 145 and the second gate electrodes 144e and 144f may be formed on the layer(s) 142 to fill the remaining portions of the grooves. The control gate electrodes 145 and the second gate electrodes 144e and 144f may be separated from one another according to the various levels. In some exemplary embodiments, the control gate electrodes 145 may serve as word lines. The control gate electrodes 145 at the same level may be electrically connected to each another via a contact plug or a wiring (not shown). The second gate electrodes 144e and 144f of the SSTs may be disposed over the control gate electrodes 145, as illustrated in FIGS. 2A and 2B.

In some exemplary embodiments, the control gate electrodes 145 and the second gate electrodes 144e and 144f filling the grooves may have a linear shape extending in the first direction. The control gate electrodes 145 and the second gate electrodes 144e and 144f may at least partially surround the second semiconductor pattern 136. The gate electrodes 145, 144e and 144f in different levels may not be electrically connected to each other. The control gate electrodes 145 and the second gate electrodes 144e and 144f may include a metal having a low resistance, and thus the control gate electrodes 145 and the second gate electrodes 144e and 144f may have a reduced thickness. Accordingly, the vertical semiconductor device may have a relatively small height.

In some exemplary embodiments, the control gate electrodes 145 and the second gate electrodes 144e and 144f may include a different material from that of the first gate electrode 121. In some exemplary embodiments, the thickness of the first gate electrode 121 may be different from the thickness of the second gate electrodes 144e and 144f and the control gate electrodes 145. In some exemplary embodiments, the first gate electrode 121 may have a greater thickness than that of each of the second gate electrodes 144e and 144f and the control gate electrodes 145. Thus, the GST may have a greater gate length, i.e., channel length, than that of each of the cell transistors and the SSTs.

As described above, in some exemplary embodiments, the cell transistors including the tunnel insulation layer, the charge trapping layer, the blocking dielectric layer, and the control gate electrode 145 may be formed in the grooves between the insulating interlayer patterns 133. In some exemplary embodiments, the SSTs may have a structure substantially the same as that the structure of the cell transistors, and thus may have a gate length substantially the same as the gate length of the cell transistor, which may be relatively small. However, according to the inventive concept, because two SSTs may be formed in a string and may be connected in series, a switching operation failure is eliminated.

In some exemplary embodiments, a second insulation layer pattern 148 may be disposed in a gap between multi-stacked structures that include the second gate electrodes 144e and 144f, the control gate electrodes 145 and the insulating interlayer patterns 133, including insulating interlayer patterns 113a through 133f. In some exemplary embodiments, the second insulation layer pattern 148 may have a linear shape extending in the first direction.

In some exemplary embodiments, an impurity region 117 may be formed at an upper portion of the substrate 100 under first insulation layer pattern 122. The impurity region 117 may serve as a common source line (CSL). In some exemplary embodiments, the impurity region 117 may be doped with impurities, for example, n-type impurities. A metal silicide pattern 120b may be formed on the impurity region 117.

An upper insulating interlayer 150 may be formed on the second semiconductor pattern 136, the second insulation layer pattern 148 and an uppermost insulating interlayer pattern 133f. A bit line contact 152 may be formed through the upper insulating interlayer 150 to be electrically connected to the second semiconductor pattern 136. A bit line 154 may be formed on the upper insulating interlayer 150 to contact the bit line contact 152. The bit line 154 may have a linear shape extending in the second direction.

FIG. 3A to 3K are schematic cross-sectional views illustrating a method of manufacturing the vertical semiconductor device of FIGS. 1 and 2, according to some embodiments of the inventive concept.

Figure 3A:
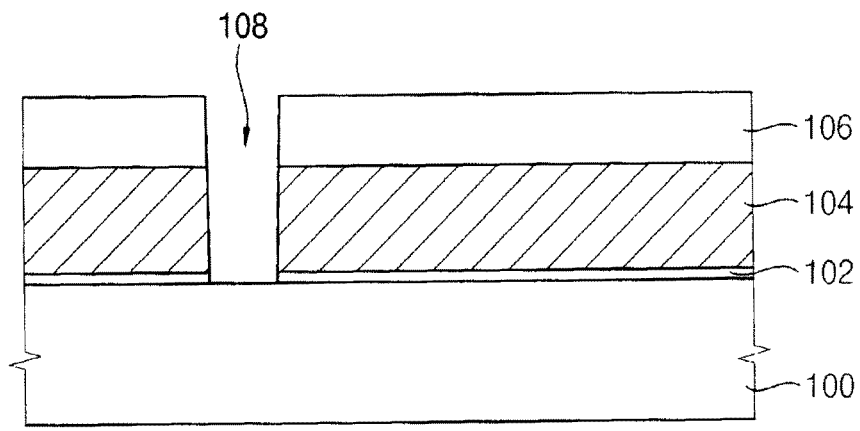

Referring to FIG. 3A, a pad insulation layer 102 may be formed on a substrate 100. The pad insulation layer 102 may be formed by, for example, a thermal oxidation process. In some exemplary embodiments, the pad insulation layer 102 may serve as a portion of a gate insulation layer of a GST.

A first conductive layer 104 may be formed on the pad insulation layer 102. In some exemplary embodiments, the first conductive layer 104 may serve as a gate electrode of the GST. In some exemplary embodiments, the first conductive layer 104 may be formed using, for example, polysilicon. Alternatively, in some exemplary embodiments, the first conductive layer 104 may be formed using a metal which is patterned by a photolithography process and which is stable to high temperature.

A buffer layer 106 may be formed on the first conductive layer 104. In some exemplary embodiments, the buffer layer may be formed using, for example, silicon oxide.

The buffer layer 106, the first conductive layer 104 and the pad insulation layer 102 may be partially and sequentially removed to form a first opening 108 that exposes a top surface of the substrate 100.

Figure 3B:
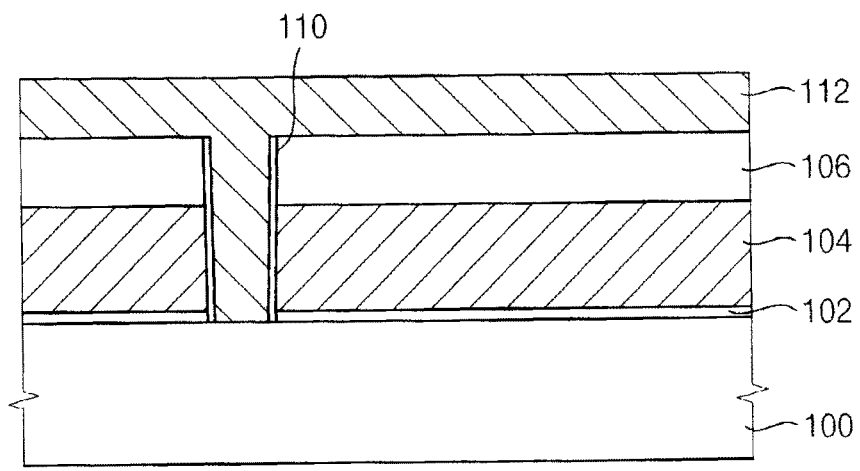

Referring to FIG. 3B, a preliminary gate insulation layer (not shown) may be formed on a sidewall and a bottom of the first opening 108, that is, conformally in the first opening 108. In some exemplary embodiments, the preliminary gate insulation layer may be formed using, for example, silicon oxide. The method used to form the preliminary gate insulation layer as well as the thickness of the preliminary gate insulation layer may be selected based on desired operational characteristics of the GSTs being formed. The preliminary gate insulation layer may be anisotropically etched to expose a top surface of the substrate, thereby forming a gate insulation layer 110 remaining on the sidewall of the first opening 108.

A first semiconductor layer 112 may be formed on the gate insulation layer 110, the buffer layer 106 and the substrate 100 to fill the first opening 108. The first semiconductor layer 112 may serve as a channel region of the GST. In some exemplary embodiments, the first semiconductor layer 112 may be formed using, for example, polysilicon or polysilicon doped with p-type impurities. Alternatively, in some exemplary embodiments, the first semiconductor layer 112 may be formed using single crystalline silicon.

Figure 3C:
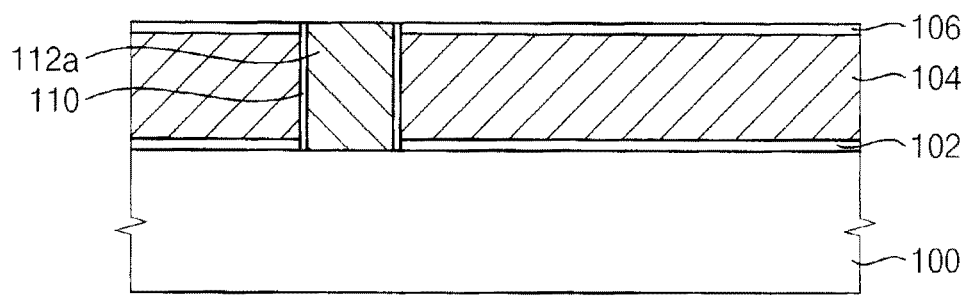

Referring to FIG. 3C, a polishing process may be performed to remove an upper portion of the first semiconductor layer 112 on the buffer layer 106 and an upper portion of the buffer layer 106, to form a first semiconductor pattern 112a in the first opening 108. In some exemplary embodiments, the polishing process removes most of the buffer layer 106 such that the remaining buffer layer 106 has a very small thickness.

Figure 3D:
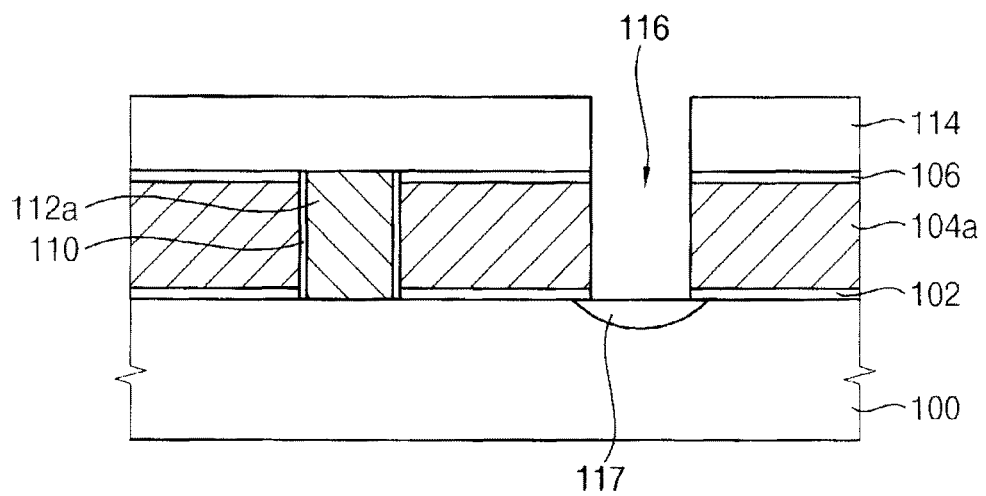

Referring to FIG. 3D, a lower insulating interlayer 114 may be formed on the buffer layer 106 and the first semiconductor pattern 112a. In some exemplary embodiments, the lower insulating interlayer 114 may be formed using, for example, silicon oxide. In some exemplary embodiments, the lower insulating interlayer 114 may be formed using a material substantially the same as that of the buffer layer 106.

The lower insulating interlayer 114, the buffer layer 106, the first conductive layer 104 and the pad insulation layer 102 may be partially and sequentially etched to form a second opening 116 between multiple adjacent first semiconductor patterns 112a. The second opening 116 may extend in the first direction. As a result of forming the second opening 116, a first conductive layer pattern 104a surrounding the first semiconductor pattern 112a may extend in the first direction. In some exemplary embodiments, the first conductive layer pattern 104a may serve as a gate electrode of the GST.

An impurity region 117 may be formed at an upper portion of the substrate 100 exposed by the second opening 116. In some exemplary embodiments, the impurity region 117 may be doped with, for example, n-type impurities. The impurity region 117 may serve as a CSL extending in the first direction.

Figure 3E:
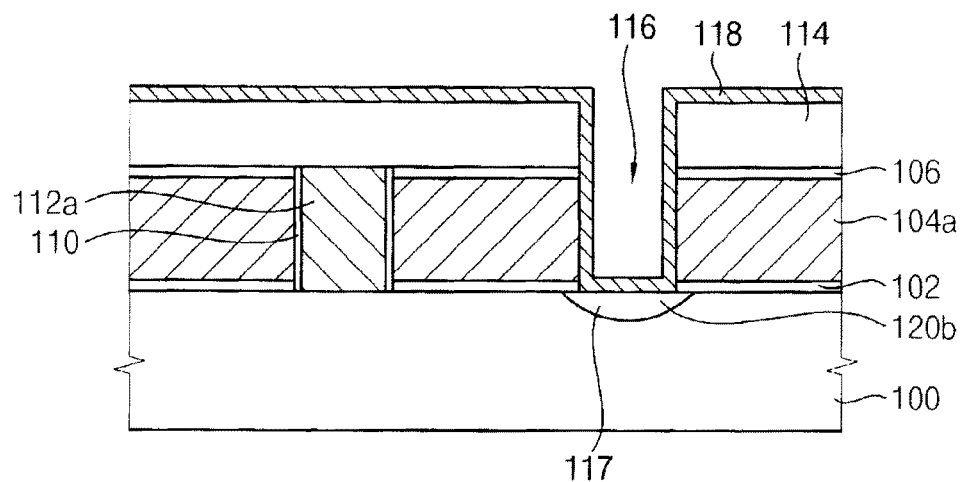

Referring to FIG. 3E, a metal layer 118 may be formed on the lower insulating interlayer 114 and a sidewall and a bottom of the second opening 116, that is, conformally in the second opening 116. In some exemplary embodiments, the metal layer 118 may be formed using, for example, cobalt (Co). The metal layer 118 may be easily formed because the second opening 116 may have a low aspect ratio.

Figure 3F:
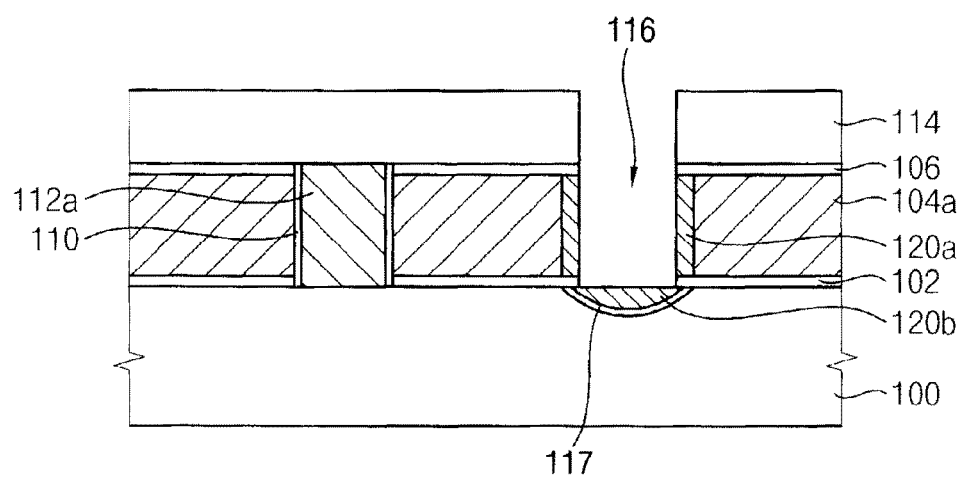

Referring to FIG. 3F, metal silicide pattern 120a may be formed by a reaction between the metal layer 118 and silicon of the first conductive layer 104; and metal silicide pattern 120b may be formed by a reaction between the metal layer 118 and silicon of the substrate 100. In some exemplary embodiments, the metal silicide patterns 120a and 120b may be formed to include, for example, tungsten silicide, cobalt silicide, nickel silicide, or other such material.

A portion of the metal layer 118 that remains unreacted may be removed.

Accordingly, according to some exemplary embodiments, the metal silicide pattern 120a may be formed at sidewalls of the first conductive layer pattern 104a exposed by the second opening 116. In some exemplary embodiments, the first conductive layer pattern 104a and the metal silicide layer pattern 120a may form the gate electrode of the GST. Similarly, in some exemplary embodiments, the metal silicide pattern 120b may be formed at the upper portion of the substrate 100 exposed by the second opening 116. In some exemplary embodiments, the metal silicide pattern 120b together with the impurity region 117 may serve as the CSL.

Figure 3G:
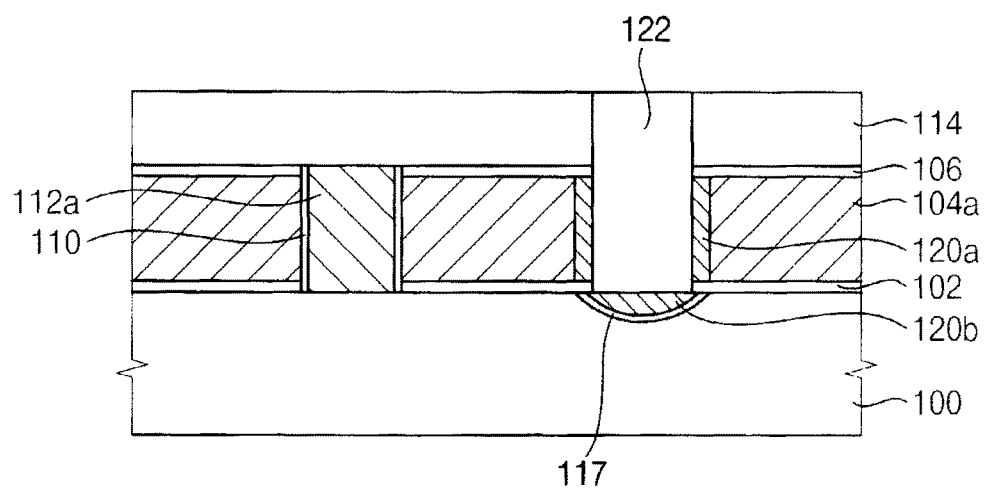

Referring to FIG. 3G, a lower insulation layer may be formed on the substrate 100 to fill the second opening 116. To form the lower insulation layer, an upper portion of the lower insulation layer formed on the lower insulating interlayer 114 may be planarized. As a result, the upper portion of the lower insulation layer is removed to form a first insulation layer pattern 122 filling the second opening 116. By performing the above processes, the GST having a vertical channel region may be formed on the substrate 100.

Figure 3H:
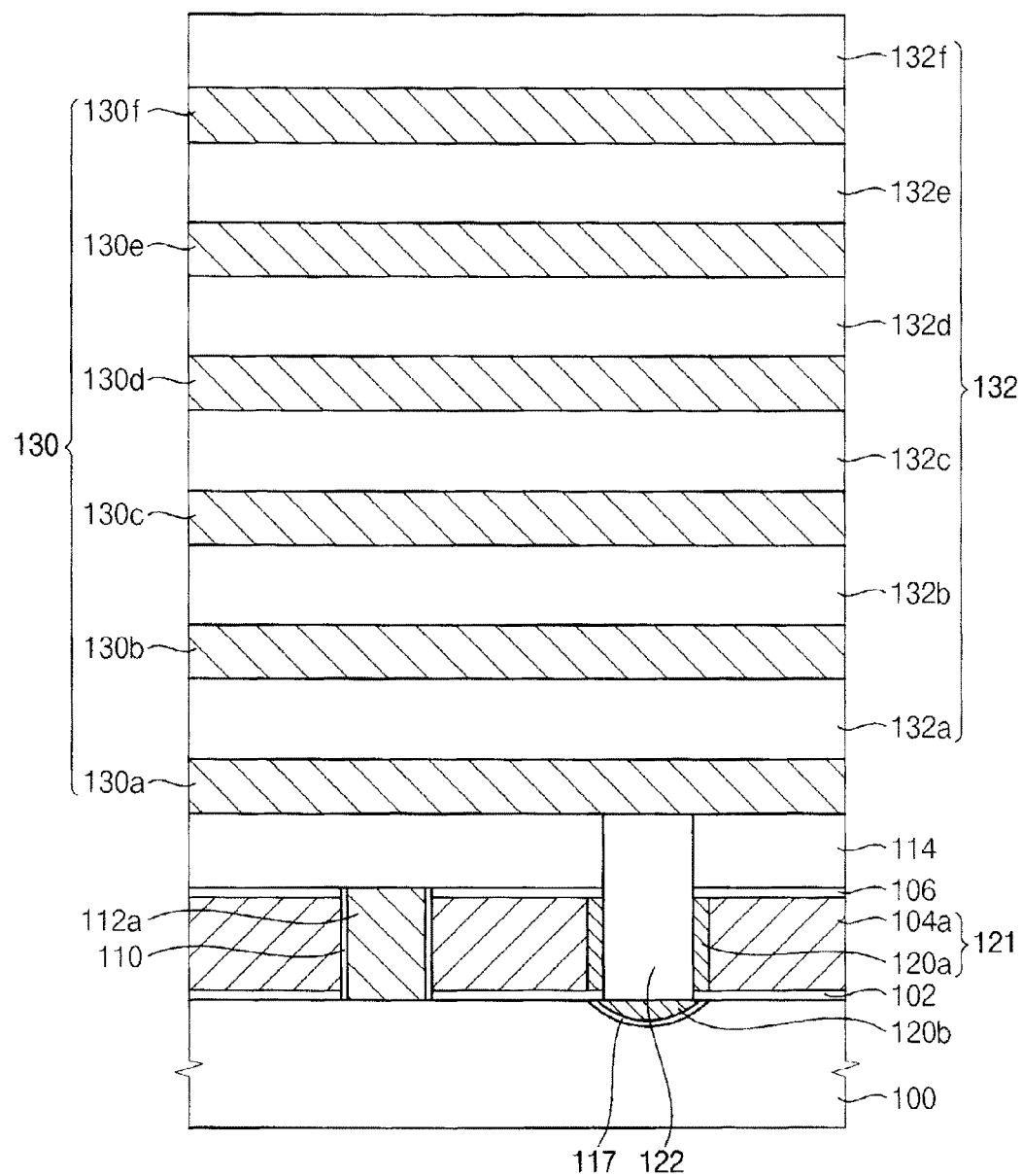
Figure 31:
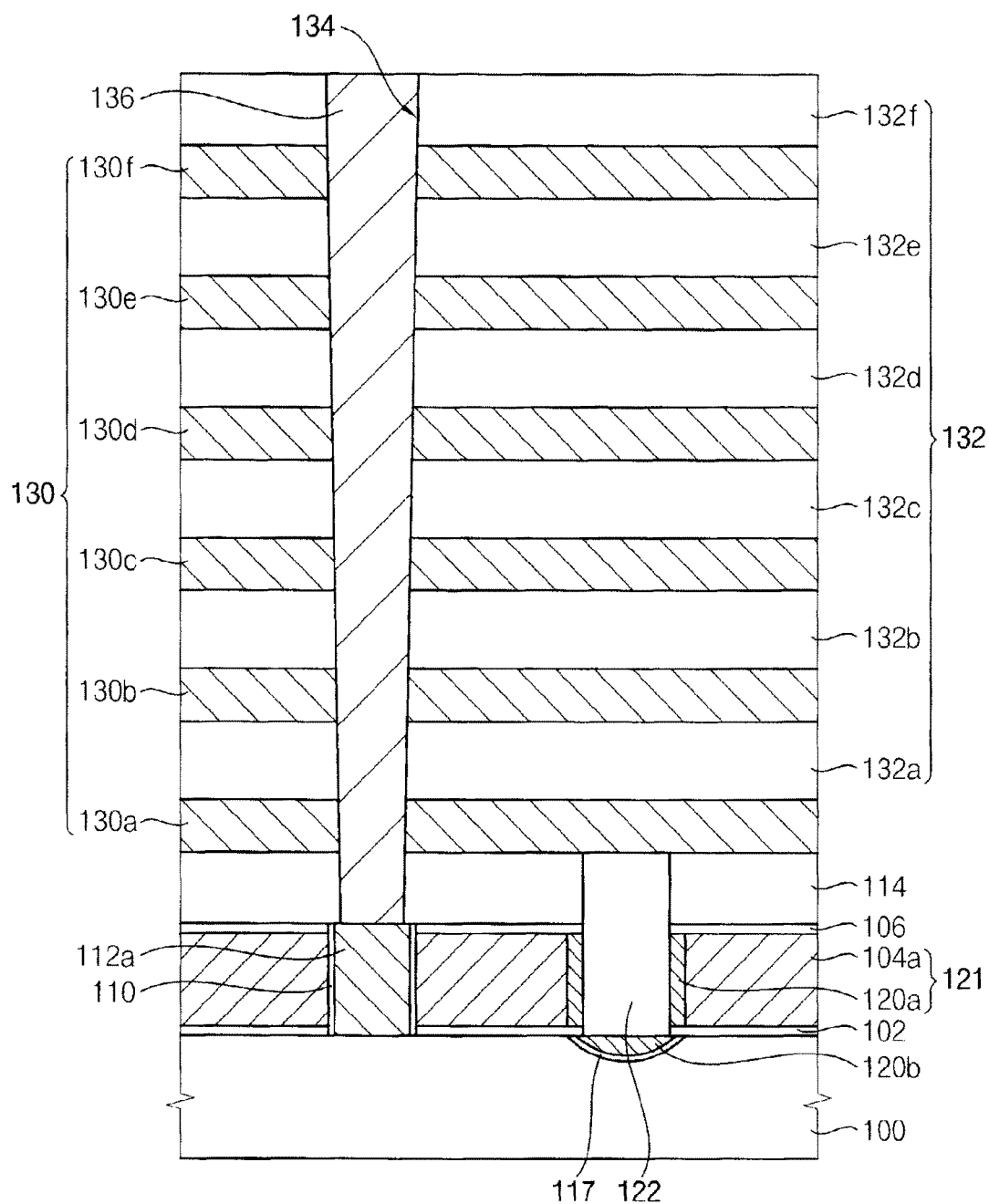

Referring to FIG. 3H, sacrificial layers 130 and insulating interlayers 132 may be repeatedly and alternately formed on the lower insulating interlayer 114 and the first insulation layer pattern 122. Specifically, a first sacrificial layer 130a may be formed on the lower insulating interlayer 114 and the first insulation layer pattern 122. Next, a first insulating interlayer 132a may be formed on the first sacrificial layer 130a. Similarly, other sacrificial layers 130b-130f and insulating interlayers 132b-132f may be sequentially and alternately formed on each other. In some exemplary embodiments, the sacrificial layers 130 and the insulating interlayers 132 may be formed by, for example, a chemical vapor deposition (CVD) process.

If the sacrificial layers 130 have different thicknesses relative to each other, gate structures may not be easily formed in grooves that may be defined after removal of the sacrificial layers 130. As a result, distribution of characteristics of the cell transistors that include the gate structures may be irregular. To avoid this problem, in some exemplary embodiments, the sacrificial layers 130 may have a thickness substantially the same at all of the levels, or a difference between the thicknesses of the sacrificial layers 130 may be lower than about 10% of the largest thickness.

In some exemplary embodiments, the sacrificial layers 130 may be formed to have a smaller thickness than that of the conductive layer pattern 104a serving as the gate electrode of the GST. As a result, the cell transistors formed in the grooves may have a channel length smaller than that of the GST.

In some exemplary embodiments, the sacrificial layers 130 may be formed using a material that has an etching selectivity with respect to the insulating interlayers 132. Additionally, in some exemplary embodiments, the sacrificial layers 130 may be formed using a material that has an etching selectivity with respect to polysilicon of the channel region. Further, in some exemplary embodiments, the sacrificial layers 130 may be formed using a material that may be rapidly removed by a wet etching process. In some exemplary embodiments, the sacrificial layers 130 may be formed using, for example, silicon nitride, and the insulating interlayers 132 may be formed using, for example, silicon oxide.

In some exemplary embodiments, SSTs may be also formed in the grooves after the sacrificial layers 130 are removed. In general, a gate length of the SST is larger than that of the cell transistor in a string. In some exemplary embodiments, the sacrificial layers 130 may be formed to have substantially the same thickness, so that the cell transistors and the SSTs may have substantially the same gate length. Thus, at least two SSTs connected to each other in series may be formed. For example, in some exemplary embodiments, two SSTs may be formed in the grooves defined after two uppermost sacrificial layers 130e and 130f are removed.

Referring to FIG. 3I, an etching mask (not shown) may be formed on the uppermost insulating interlayer 132f. The sacrificial layers 130, the insulation interlayers 132 and the lower insulating interlayer 114 may be sequentially and partially removed by etching using the etching mask to form a third opening 134. In some exemplary embodiments, the third opening 134 is formed through the sacrificial layers 130, the insulating interlayers 132 and the lower insulating interlayer 114 to the top surface of the first semiconductor pattern 112a. That is, a top surface of the first semiconductor pattern 112a may be exposed by the third opening 134.

As described above, the third opening 134 may be formed to expose the top surface of the first semiconductor pattern 112a, but not the surface of the substrate 100. Accordingly, the number of layers that need to be etched to form the third opening 134 may be reduced so that the third opening 134 may be formed without difficulty due to aspect ratio. Further, the third opening 134 may be formed to have a low aspect ratio.

A second semiconductor layer may be formed on the first semiconductor pattern 112a and the uppermost insulating interlayer 132f to fill the third opening 134. The third opening 134 may have a low aspect ratio so that the second semiconductor layer may be formed without difficulty. The opening 134 and, therefore, the second semiconductor layer may be substantially cylindrical in shape, but may also have a slight taper, as shown in the figures, due to manufacturing. In some exemplary embodiments, the second semiconductor layer may be formed using, for example, polysilicon. Alternatively, in some exemplary embodiments, the second semiconductor layer may be formed using single crystalline silicon.

An upper portion of the second semiconductor layer may be planarized until the uppermost insulating interlayer 132f is exposed to form a second semiconductor pattern 136 in the third opening 134. In some exemplary embodiments, the second semiconductor pattern 136 may serve as a channel region of the cell transistors and the SSTs.

Figure 3J:
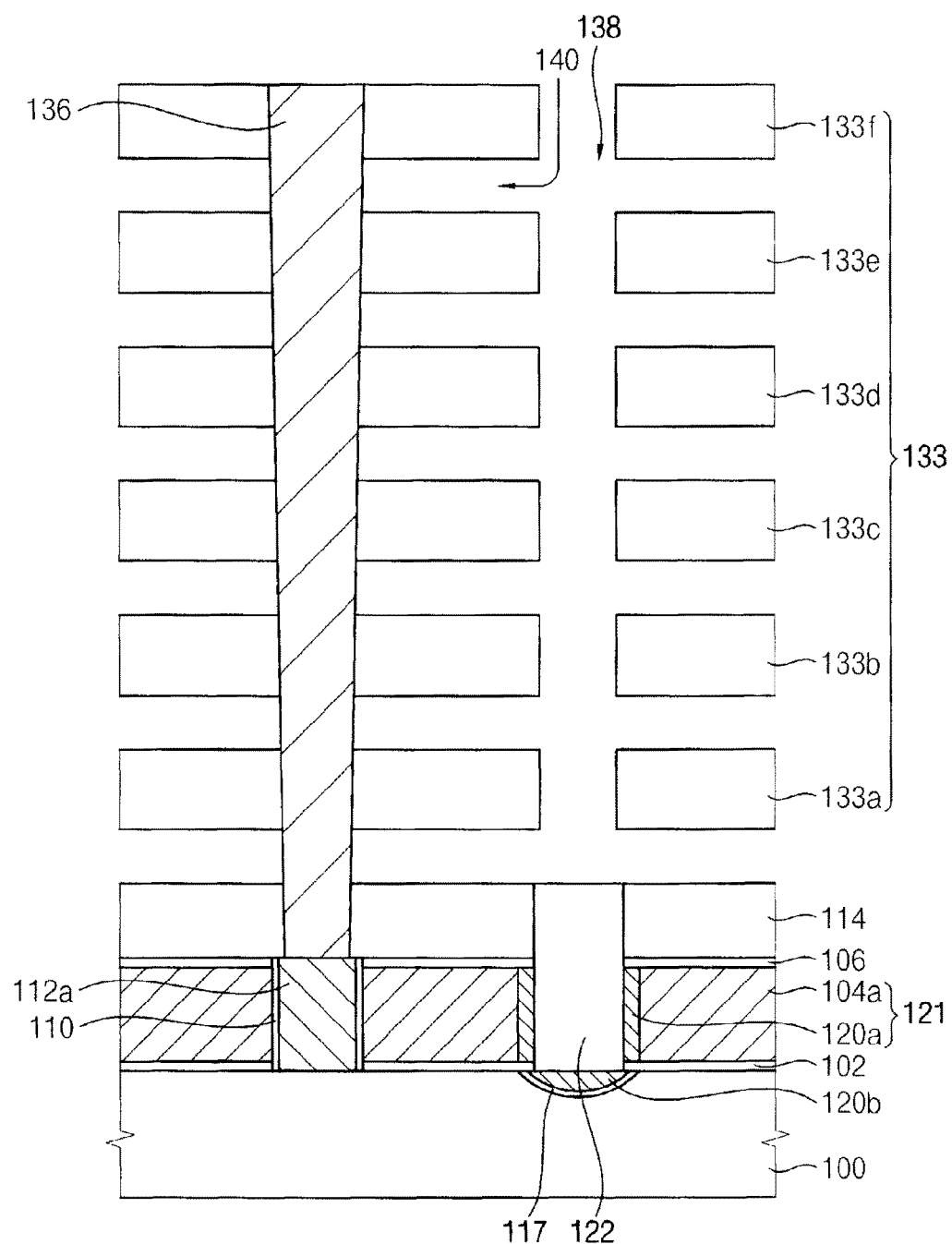

Referring to FIG. 3J, the sacrificial layers 130 and the insulating interlayers 132 between the second semiconductor patterns 136 may be partially etched to form a fourth opening 138 that exposes a top surface of the first insulation layer pattern 122. The fourth opening 138 may extend from the top surface of the first insulation layer pattern 122 in the third direction. By forming the fourth opening 138, insulating interlayer patterns 133 and sacrificial layer patterns (not shown) may be formed to have a linear shape extending in the first direction. The insulating interlayer patterns 133 and the sacrificial layer patterns may at least partially surround a sidewall of the second semiconductor pattern 136.

In some exemplary embodiments, the fourth opening 138 may be formed to expose the top surface of the first insulation layer pattern 122, but not the top surface of the substrate 100. Accordingly, the number of layers that need to be etched for forming the fourth opening 138 may be reduced so that the fourth opening 138 may be readily formed.

The sacrificial layer patterns exposed by the fourth opening 138 may be removed by a selective wet etching process. By performing the processes, according to some exemplary embodiments, only the insulating interlayer patterns 133 may remain on the sidewall of the second semiconductor pattern 136, the insulating interlayer patterns 133 being spaced apart from one another by a given distance. Grooves 140 exposing the sidewalls of the second semiconductor pattern 136 may be formed between the insulating interlayer patterns 133.

Figure 3K:
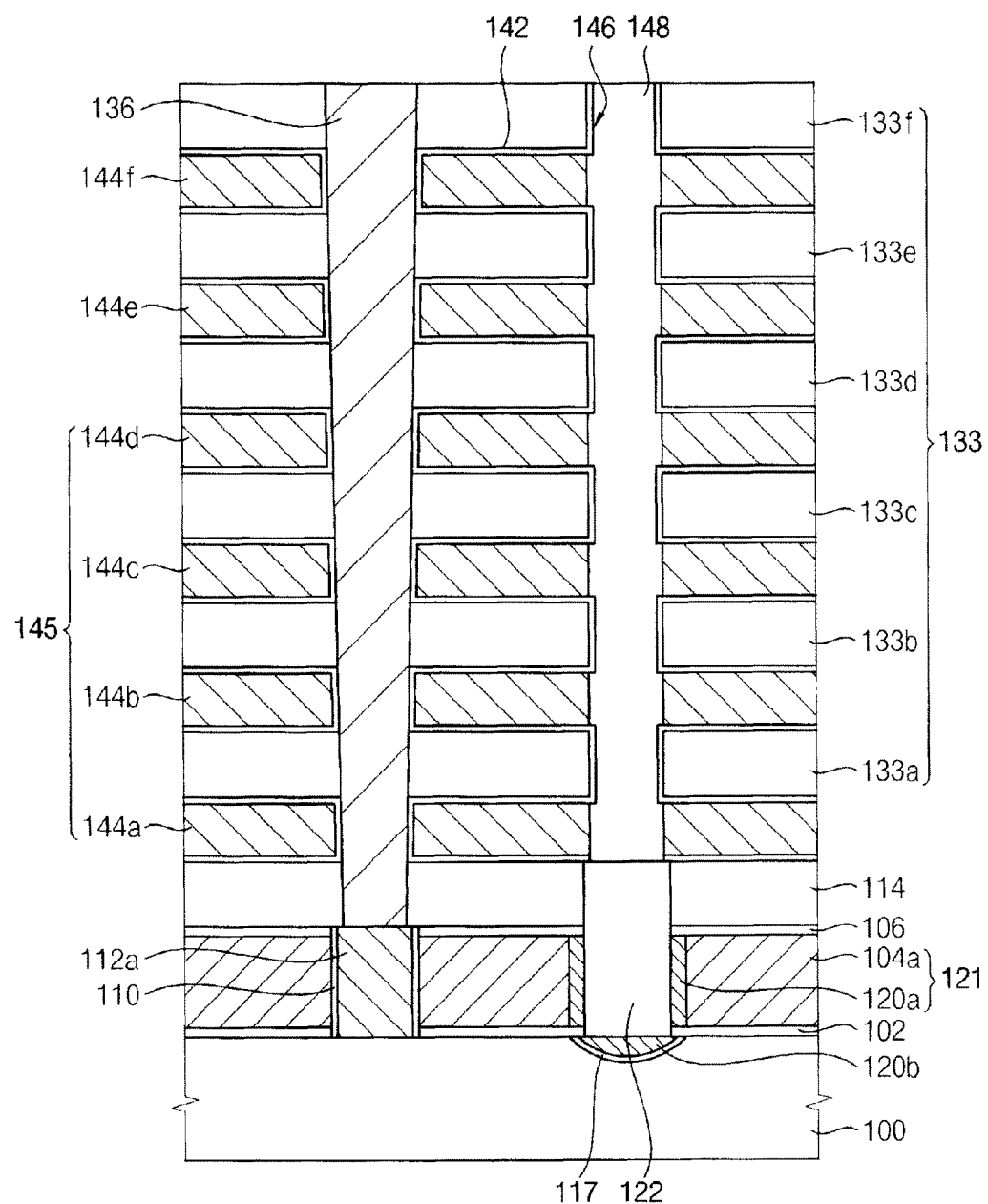

Referring to FIG. 3K, in some exemplary embodiments, a tunnel insulation layer, a charge trapping layer and a blocking dielectric layer may be formed on the exposed sidewall of the second semiconductor pattern 136 and surfaces of the insulating interlayer patterns 133. The tunnel insulation layer, the charge trapping layer and the blocking dielectric layer are collectively illustrated as a single layer 142 for the purpose of simplicity of illustration.

In some exemplary embodiments, the tunnel insulation layer may be formed using, for example, silicon oxide.

In some exemplary embodiments, the charge trapping layer may be formed using, for example, silicon nitride or a metal oxide. In some exemplary embodiments, the charge trapping layer may be formed to be connected to each other throughout all levels of the device structure. However, alternatively, in some exemplary embodiments, the charge trapping layer may include an insulating material so that the cell transistors may be insulated from each other.

In some exemplary embodiments, the blocking dielectric layer may be formed using, for example, silicon oxide, a metal oxide such as aluminum oxide, or other similar material. In some exemplary embodiments, the blocking dielectric layers may be formed to be connected to each other throughout all levels in a similar manner to that of the charge trapping layer.

In some exemplary embodiments, a conductive layer may be formed on the blocking dielectric layer to sufficiently fill the grooves 140 and partially fill the fourth opening 138. In some exemplary embodiments, the conductive layer may be formed using a conductive material that has good step coverage to prevent voids from being formed therein. The conductive material may be formed using, for example, a metal or a metal nitride having a low resistance, for example, tungsten, tungsten nitride, titanium, titanium nitride, tantalum, tantalum nitride or platinum. In some exemplary embodiments, a barrier metal layer including, for example, titanium, titanium nitride, tantalum or tantalum nitride may be formed, and then a metal layer including, for example, tungsten, may be formed thereon.

In some exemplary embodiments, a portion of the conductive layer formed in the fourth opening 138 may be removed using, for example, a dry etching process or a wet etching process. The tunnel insulation layer, the charge trapping layer, and the blocking dielectric layer on a bottom of the fourth opening 138 may be also removed to form a fifth opening 146.

Thus, the conductive layer may remain only in the grooves 140 to form control gate electrodes 145. The control gate electrodes 145 may be formed to be spaced apart from each other in the third direction. The control gate electrodes 144 may be insulated from each other by the insulating interlayer patterns 133.

Transistors including the SSTs and the cell transistors may be formed by performing the above-described fabrication steps and processes, according to some embodiments of the inventive concept. In some exemplary embodiments, the two uppermost of the transistors may serve as the SSTs.

As shown in FIG. 3K, in some exemplary embodiments, the tunnel insulation layer, the charge trapping layer, the blocking dielectric layer on the insulating interlayer patterns 133 may not be removed. In this case, the charge trapping layer may be continuously connected throughout all levels of the device structure.

Alternatively, in some exemplary embodiments, in the process of forming the fifth opening 146, portions of the tunnel insulation layer, the charge-trapping layer and/or the blocking dielectric layer formed on sidewalls of the insulating interlayer patterns 133 may be etched together with the conductive layer. In this case, the tunnel oxide layer, the charge-trapping layer and/or the blocking dielectric layer in different levels may be separated from each other.

As described above, in some exemplary embodiments, the impurity region 117 and the metal silicide pattern 120b serving as the CSL may be formed prior to forming the fifth opening 146. Thus, according to the exemplary embodiments, processes for forming the CSL may not be required after forming the fifth opening 146.

In some exemplary embodiments, an insulation layer may be formed on the first insulation layer pattern 122 and an uppermost insulating interlayer pattern 133f to fill the fifth opening 146. The insulation layer may be planarized to form a second insulation pattern 148 in the fifth opening 146.

Referring to FIG. 2A again, in some exemplary embodiments, an upper insulating interlayer 150 may be formed on top surfaces of the second semiconductor pattern 136, the uppermost insulating interlayer pattern 133f and the second insulation layer pattern 148. A bit line contact 152 may be formed through the upper insulating interlayer 150 to contact the top surface of the second semiconductor pattern 136. A bit line 154 may be formed on the upper insulating interlayer 150 to contact the bit line contact 152. In some exemplary embodiments, the bit line 152 may have a linear shape extending in the second direction and may be electrically connected to the second semiconductor pattern 136 via the bit line contact 152.

In some exemplary embodiments, the vertical semiconductor device of the exemplary embodiments of the inventive concept may be manufactured as illustrated in and described in detail in connection with FIG. 2A by performing the above steps as described above in detail.

According to some exemplary embodiments, the vertical semiconductor device may have a decreased height. Further, the second semiconductor pattern 136 and the gate electrodes 145, 144e and 144f may be easily formed because the openings for forming the second semiconductor pattern 136 and the gate electrodes 145, 144e and 144f may have a low aspect ratio. Furthermore, a CSL may also readily formed because the CSL may be formed in advance to forming the cell transistors.

Figure 4:
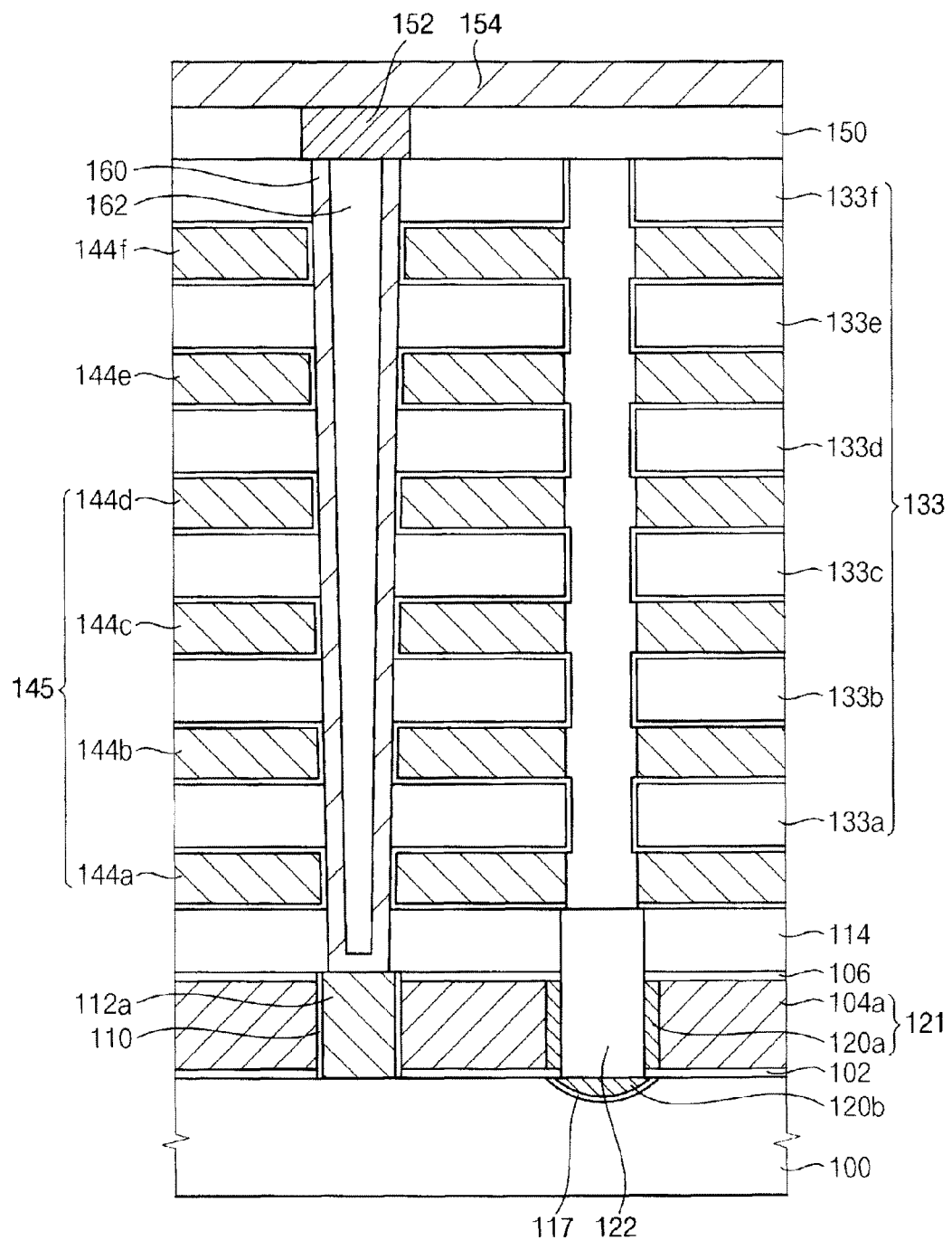
FIG. 4 is a schematic cross-sectional view illustrating a vertical semiconductor device, in accordance with exemplary embodiments of the inventive concept.
Figure 5:
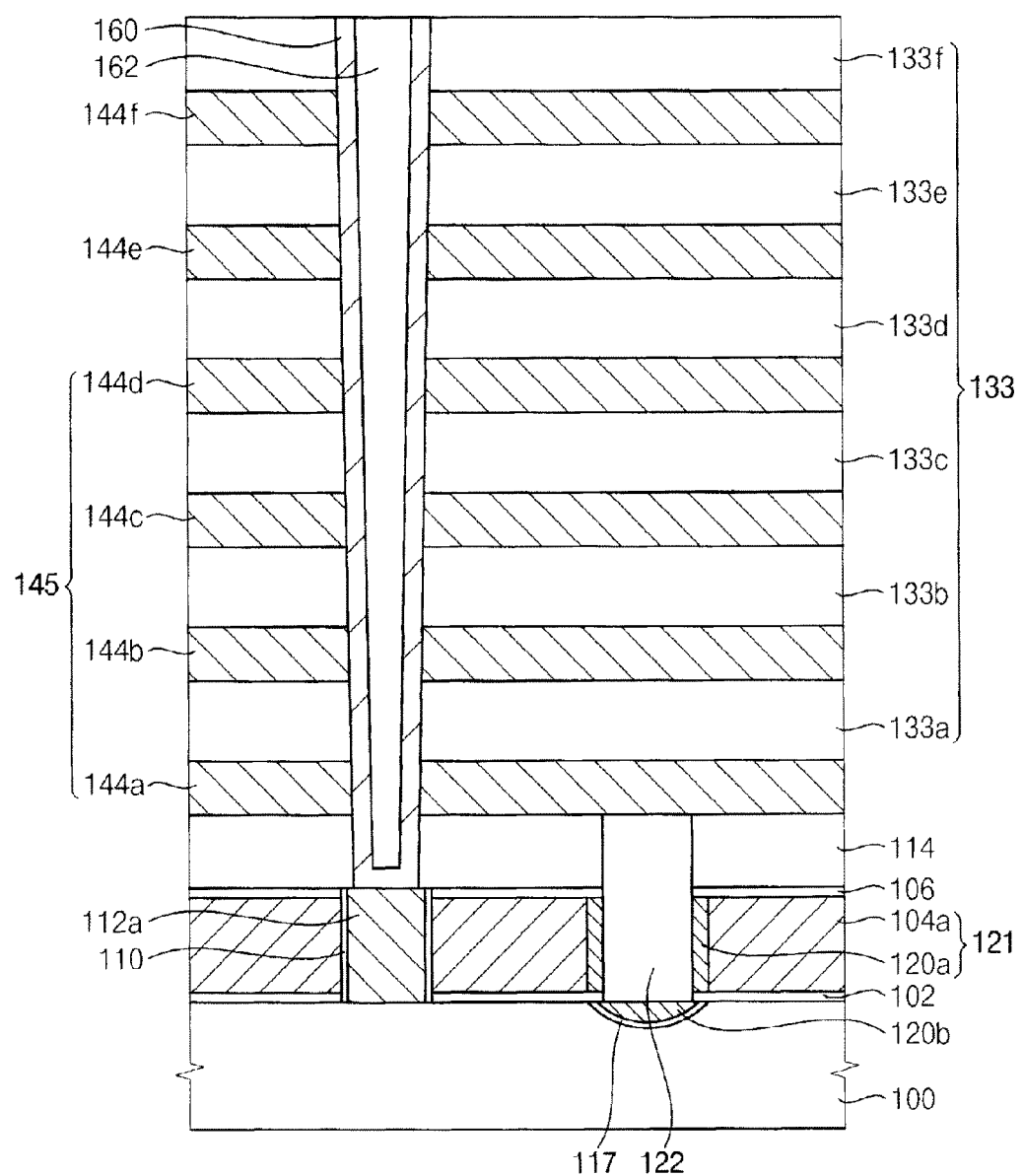
FIG. 5 is a schematic cross-sectional view illustrating a method of manufacturing the vertical semiconductor device of FIG. 4, in accordance with exemplary embodiments of the inventive concept.

FIG. 4 is a schematic cross-sectional view illustrating a vertical semiconductor device in accordance with exemplary embodiments. FIG. 5 is a schematic cross-sectional view illustrating a method of manufacturing the vertical semiconductor device of FIG. 4, according to exemplary embodiments. The vertical semiconductor device illustrated in FIG. 4 may have a structure substantially the same as that illustrated in FIGS. 1 and 2, except for the configuration of the second semiconductor pattern.

Referring to FIG. 4, the first semiconductor pattern 112a and the GST may be formed as shown in and described in detail in connection with FIG. 2A. A second semiconductor pattern 160 may be disposed on a top surface of the first semiconductor pattern 112a. The second semiconductor pattern 160 may have a hollow cylindrical shape or a cup shape or a slightly tapered shape. A filling layer pattern 162 may be formed inside the second semiconductor pattern 160. Other structural elements may be formed in substantially the same manner as illustrated in and described in detail in connection with FIG. 2A.

The vertical semiconductor device illustrated in FIG. 4 may be manufactured by the following steps and processes. Processes substantially the same as those illustrated in and described in detail with reference to FIGS. 3A to 3H may be performed to form the structure as shown in FIG. 3H. Referring to FIG. 5, in some exemplary embodiments, a polysilicon layer (not shown) may be formed on a sidewall and a bottom of the third opening 134, that is, conformally in the third opening 134. A filling layer (not shown) may be formed on the polysilicon layer to fill the third opening 134. Upper portions of the filling layer and the polysilicon layer may be planarized until the uppermost insulating insulation layer 133f is exposed to form a filling layer pattern 162 and a second semiconductor pattern 160 in the third opening 134.

Next, steps and processes substantially the same as those illustrated in and described in detail with reference to FIGS. 3J to 3K may be performed to achieve the vertical semiconductor device in FIG. 4.

Figure 6A:
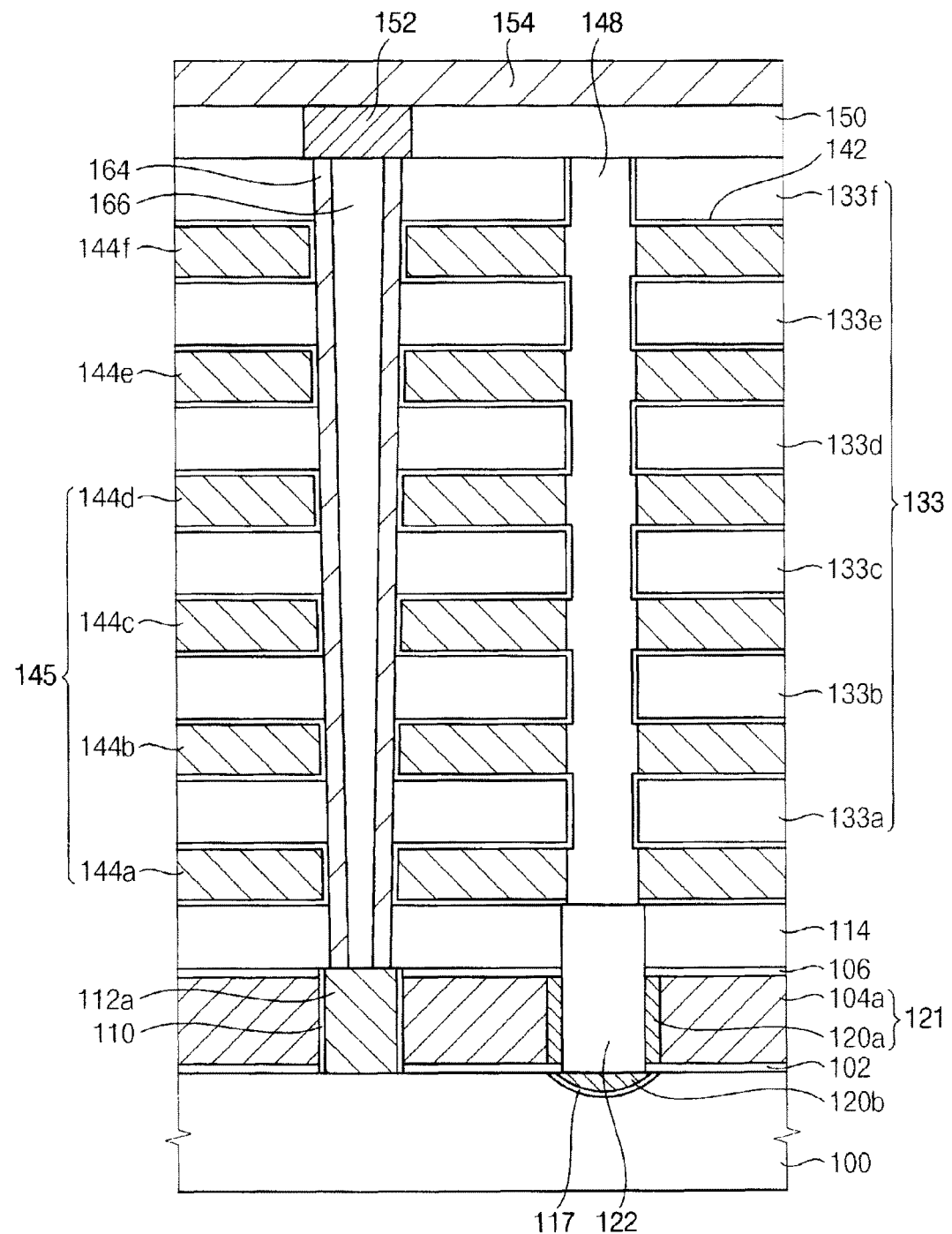
FIGS. 6A and 6B are a schematic cross-sectional view and a schematic perspective view, respectively, illustrating a vertical semiconductor device, in accordance with exemplary embodiments of the inventive concept.
Figure 6B:
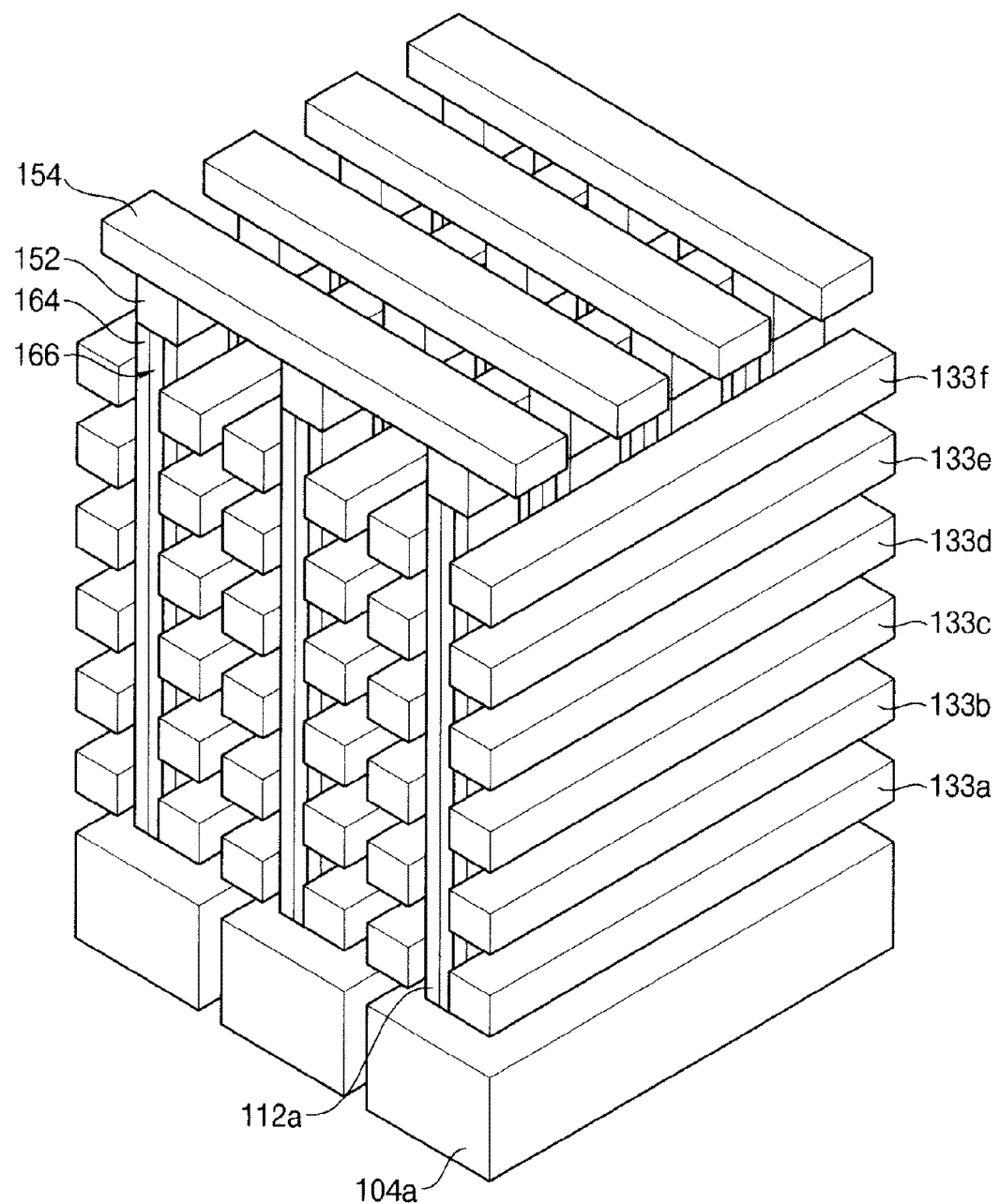

FIGS. 6A and 6B are a schematic cross-sectional view and a schematic perspective view, respectively, illustrating a vertical semiconductor device in accordance with some exemplary embodiments. Referring to FIGS. 6A and 6B, the first semiconductor pattern 112a and the GST may be formed on the substrate 100 in substantially the same manner as illustrated in and described in detail in connection with FIG. 2A. The first insulation layer pattern 122 and the lower insulating interlayer 114 may also be formed.

Continuing to refer to FIGS. 6A and 6B, in some exemplary embodiments, a pair of second semiconductor patterns 164 facing each other may be disposed on a top surface of the first semiconductor pattern 112a. In some exemplary embodiments, the second semiconductor pattern 164 may have a bar shape, e.g., a rectangular parallelepiped shape. A first filling layer pattern 166 may be disposed in a gap formed in the second direction between the facing second semiconductor patterns 164. A second filling layer pattern (not shown) may be disposed in a gap formed in the first direction between the structures including the second semiconductor patterns 164 and the first filling layer pattern 166. In some exemplary embodiments, the first and second filling layer patterns may include, for example, silicon oxide. Transistors forming a string may be disposed on an outer sidewall of the second semiconductor pattern 164.

In some exemplary embodiments, insulating interlayer patterns 133 may be disposed on the outer sidewall of the second semiconductor pattern 164, being spaced apart from each other in the third direction. The insulating interlayer patterns 133 may insulate control gate electrodes 145 and second gate electrodes 144e and 144f. The insulating interlayer patterns 133 protruding from the outer sidewall of the second semiconductor pattern 164 may be arranged to be parallel to each other in a plurality of levels of the device structure. The insulating interlayer patterns 133 may have a linear shape extending in the first direction. Grooves exposing the outer sidewall of the second semiconductor pattern 164 may be formed between the insulating interlayer patterns 133.

A tunnel insulation layer, a charge trapping layer, a blocking dielectric layer and the control gate electrodes may be formed in the grooves. The control gate electrodes 145 may be separated from each other according to the levels.

In some exemplary embodiments, the control gate electrodes 145 may have a linear shape extending in the first direction. The control gate electrodes 145 may extend facing the one outer sidewall of the second semiconductor pattern 164. The control gate electrodes 145 may not surround the entire outer sidewall of the second semiconductor pattern 164, in contrast to those illustrated in and described in detail in connection with FIG. 1. In some exemplary embodiments, the control gate electrodes 145 may include metal.

In some exemplary embodiments, a second insulation layer pattern 148 may be disposed in a gap between multi-stacked structures that include second gate electrodes 144e and 144f, the control gate electrodes 145 and the insulating interlayer patterns 133. In some exemplary embodiments, the second insulation layer pattern 148 may a linear shape extending in the first direction.

In some exemplary embodiments, two uppermost transistors may serve as SSTs. The SSTs may have a structure substantially the same as that of the cell transistors.

An upper insulating interlayer 150, a bit line contact 152 and a bit line 154 may be provided in the same manner as illustrated in and described in detail in connection with FIG. 2A.

FIG. 7A to 7D are schematic cross-sectional views illustrating a method of manufacturing a vertical semiconductor device, in accordance with exemplary embodiments of the inventive concept. According to these embodiments, steps and processes substantially the same as those illustrated in and described in detail with reference to FIGS. 3A to 3H may be performed to form the structure as shown in FIG. 3H.

Figure 7A:
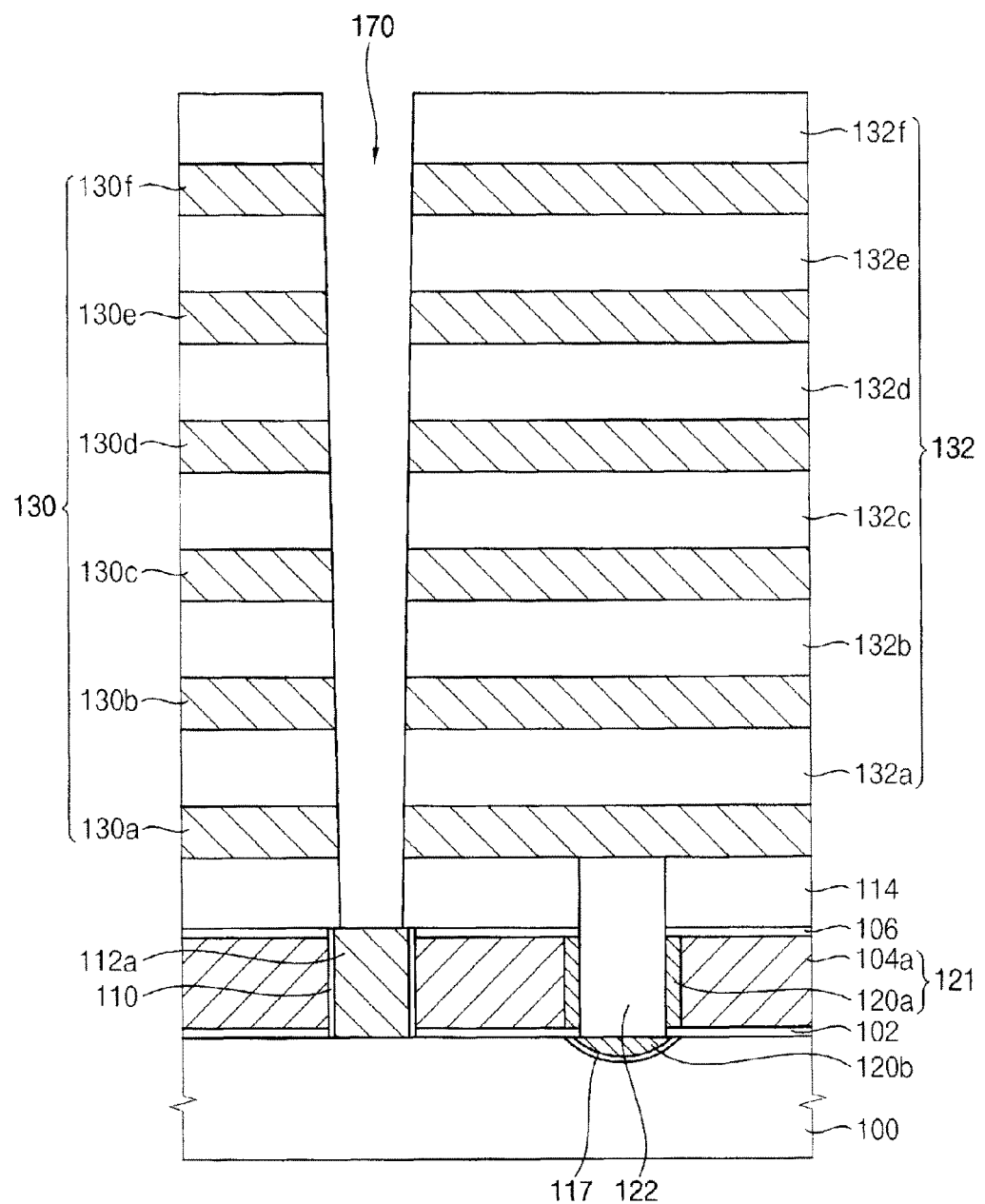
FIGS. 7A to 7D are schematic cross-sectional views illustrating a method of manufacturing a vertical semiconductor device, in accordance with exemplary embodiments of the inventive concept.

Referring to FIG. 7A, an etching mask (not shown) may be formed on the uppermost insulating interlayer 132*f*. The insulation interlayers 132 and the sacrificial layers 130 may be sequentially and partially removed by etching using the etching mask to form a first opening 170. A top surface of the first semiconductor pattern 112*a* may be exposed by the first opening 170. In some exemplary embodiments, the first opening 170 may have a linear shape extending in the first direction.

Figure 7B:
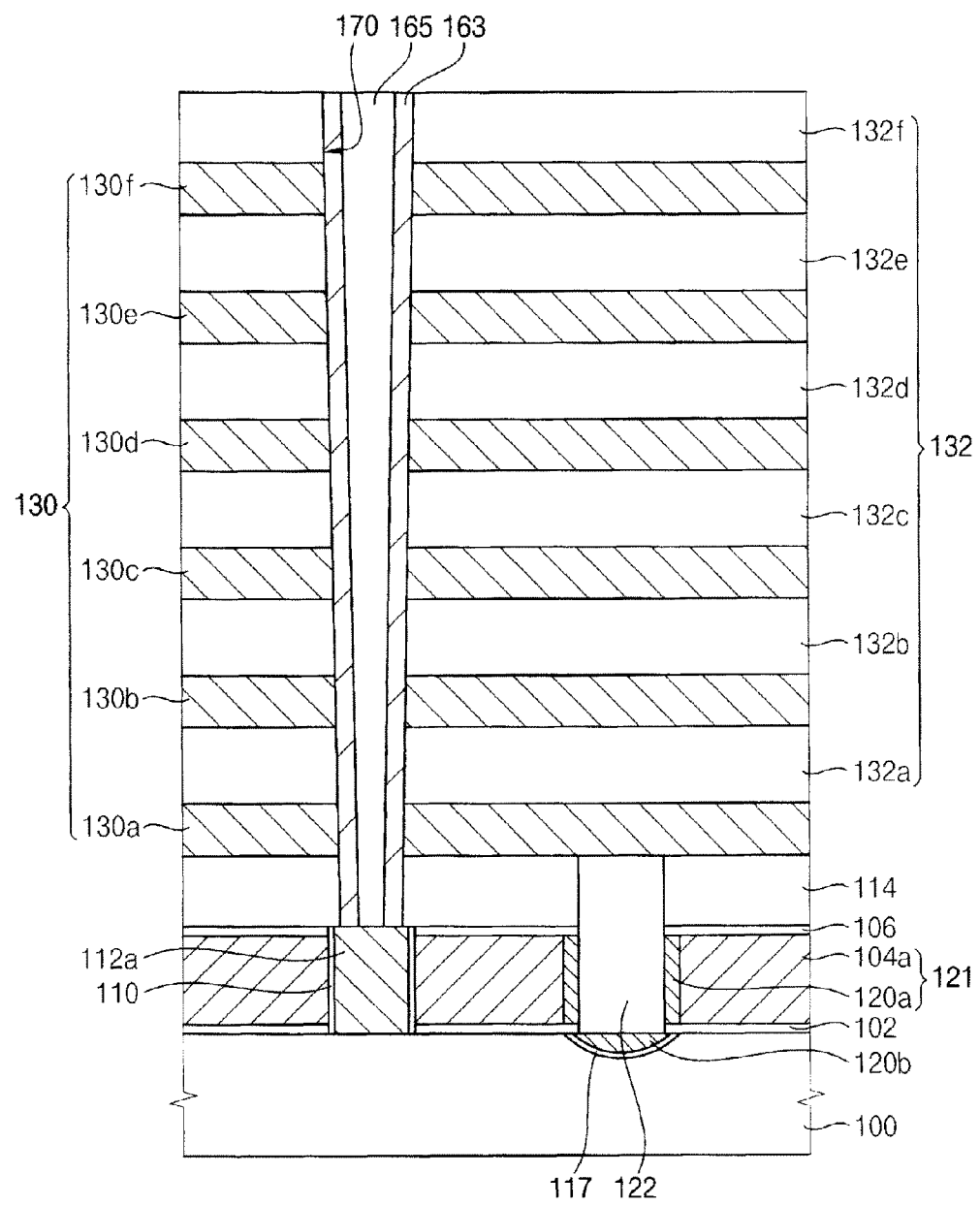

Referring to FIG. 7B, preliminary second semiconductor patterns 163 may be formed on both sidewalls of the first opening 170. A first filling layer 165 may be formed on the first semiconductor patterns 112*a* to fill the first opening 170. Accordingly, a pair of the preliminary second semiconductor patterns 163 in the first opening 170 may have a linear shape extending in the first direction. In some exemplary embodiments, the preliminary second semiconductor patterns 163 may be formed using, for example, single crystalline silicon or, for example, polysilicon.

In some exemplary embodiments, a polysilicon layer may be formed on the sidewalls and a bottom of the first opening 170. A portion of the polysilicon layer which is formed on the bottom of the first opening 170 may be removed to form the preliminary second semiconductor patterns 163 on the sidewalls of the first opening 170. An insulation layer may be formed to fill the first opening 170. An upper portion of the insulation layer may be planarized to form the first filling layer pattern 165

Figure 7C:
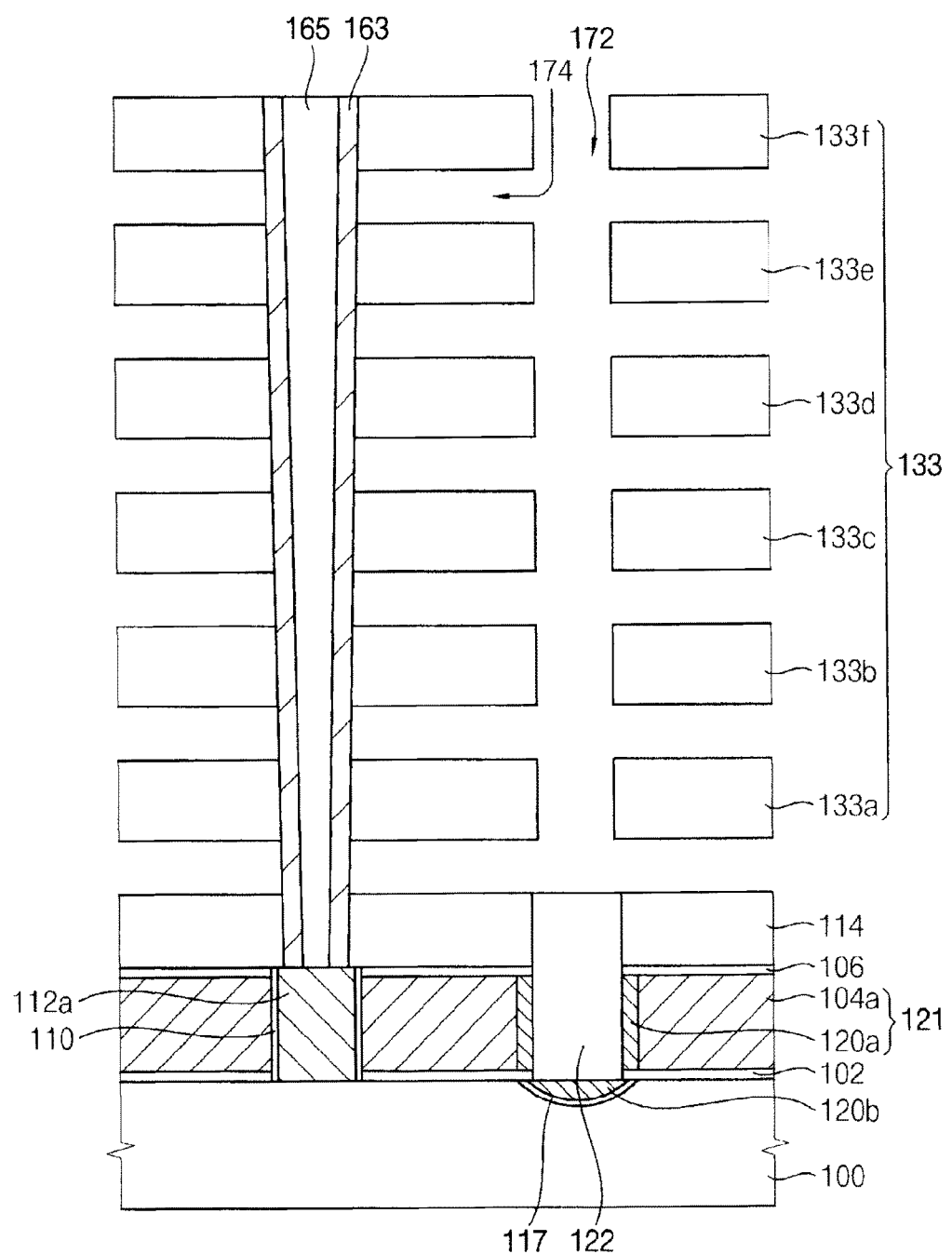

Referring to FIG. 7C, the insulating interlayers 132 and the sacrificial layers 130 between the first opening 170 may be partially etched to form a second opening 172. A top surface of the first insulation layer pattern 122 may be exposed by the second opening 172. For example, an etching mask (not shown) may be formed on the uppermost insulating interlayer 132*f* and the insulating interlayers 132 and the sacrificial layers 130 may be sequentially and partially removed by etching using the etching mask to form the second opening 172. By forming the second opening 172, sacrificial layer patterns (not shown) and insulating interlayer patterns 133 may be formed to contact the outer sidewall of the preliminary second semiconductor pattern 163 and have a linear shape extending in the first direction.

The sacrificial layer patterns exposed by sidewalls of the second opening 172 may be removed to form grooves 174. The sacrificial layer patterns may be removed by a wet etching process.

Figure 7D:
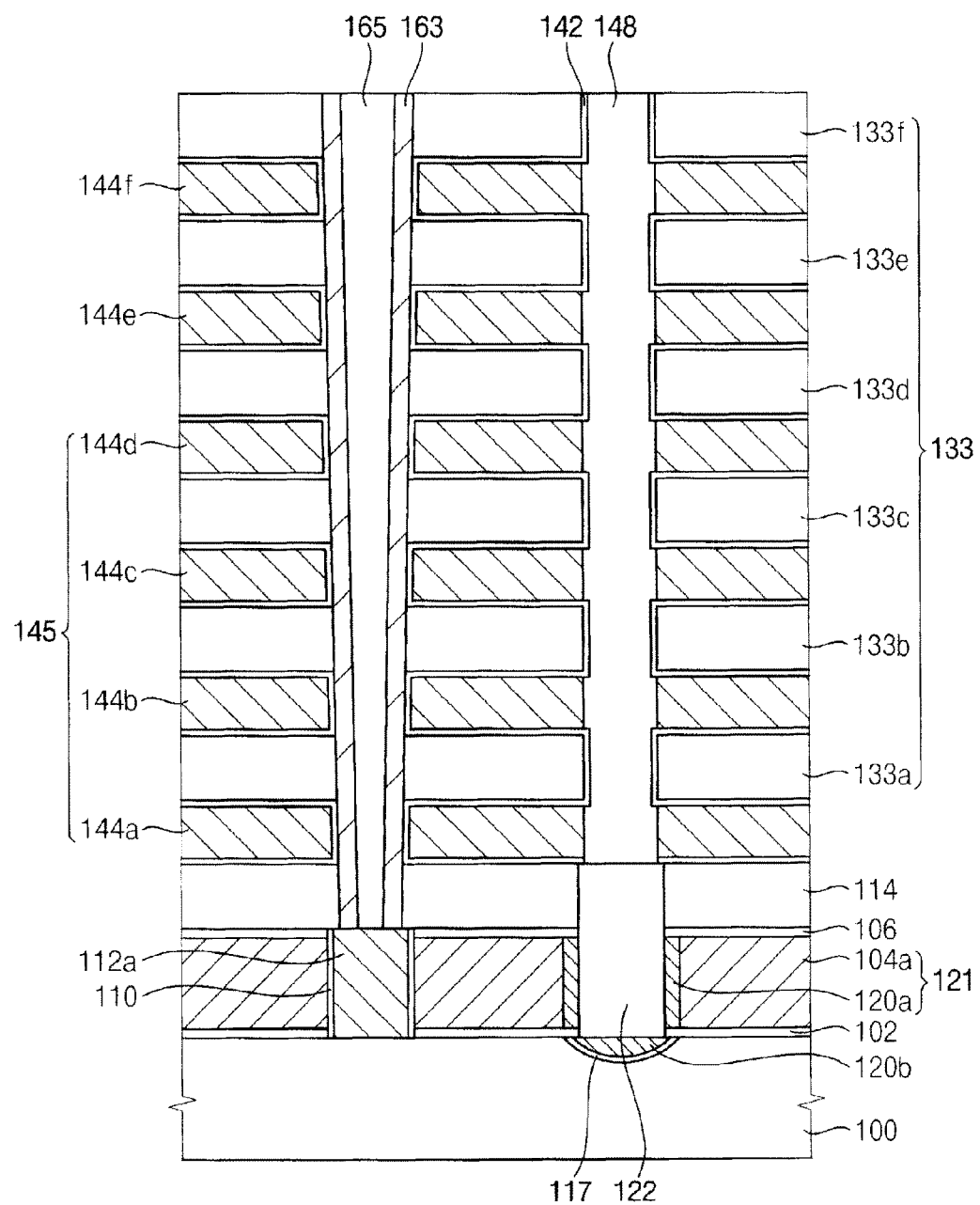

Referring to FIG. 7D, in some exemplary embodiments, steps and processes substantially the same as those illustrated in and described in detail with reference to FIG. 3K may be performed. Specifically, a tunnel insulation layer, a charge trapping layer and a blocking dielectric layer may be sequentially formed on the exposed sidewall of the preliminary second semiconductor pattern 163 and surfaces of the insulating interlayer patterns 133. The tunnel insulation layer, the charge trapping layer and the blocking dielectric layer are collectively illustrated as a single layer 142. In some exemplary embodiments, the conductive layer may be formed on the layer 142 to sufficiently fill the grooves 174. In some exemplary embodiments, a portion of the conductive layer which is formed in the second trench 172 may be etched to form a third opening (not shown).

By performing the above-described steps and processes, control gate electrodes 145 may be formed between the insulating interlayer patterns 133 to fill the grooves 174. The control gate electrodes 145 may have a linear shape extending in the first direction. In some exemplary embodiments, the control gate electrodes 145 in different levels of the device structure may be insulated from one another by the insulating interlayer patterns 133.

An insulation layer may be formed to fill the third opening and may be planarized to form a second insulation layer pattern 148.

Referring to FIG. 6A again, a mask pattern extending in the second direction may be formed on the structure illustrated in FIG. 7D. In some exemplary embodiments, the preliminary second semiconductor pattern 163 and the first filling layer 165 may be partially removed using the mask pattern as an etching mask to form openings (not shown). Accordingly, a second semiconductor pattern 164 and a first filling layer pattern 166 may be formed to have a bar shape or a rectangular parallelepiped shape.

In some exemplary embodiments, two transistors formed on an uppermost portion of the second semiconductor pattern 164 may serve as SSTs. The SSTs may have a structure substantially the same as that of the cell transistors storing data so that additional processes for forming the SSTs may not be required. Therefore, the possibility of process failure due to the addition or variation of processes is reduced.

In some exemplary embodiments, an upper insulating interlayer 150 may be formed to cover the second semiconductor patterns 164, the uppermost insulating interlayer pattern 133*f* and the first filling layer pattern 166. A bit line contact 152 may be formed through the upper insulating interlayer 150 to contact top surfaces of the second semiconductor patterns 164. A bit line 154 may be formed on the upper insulating interlayer 150 to contact a top surface of the bit line contact 152. In some exemplary embodiments, the bit line may have a linear shape extending in the second direction and may be electrically connected to the second semiconductor patterns 164 via the bit line contact 154.

As described above, a vertical semiconductor device according to exemplary embodiments having a decreased height may be manufactured by processes according to exemplary embodiments.

Figure 8:
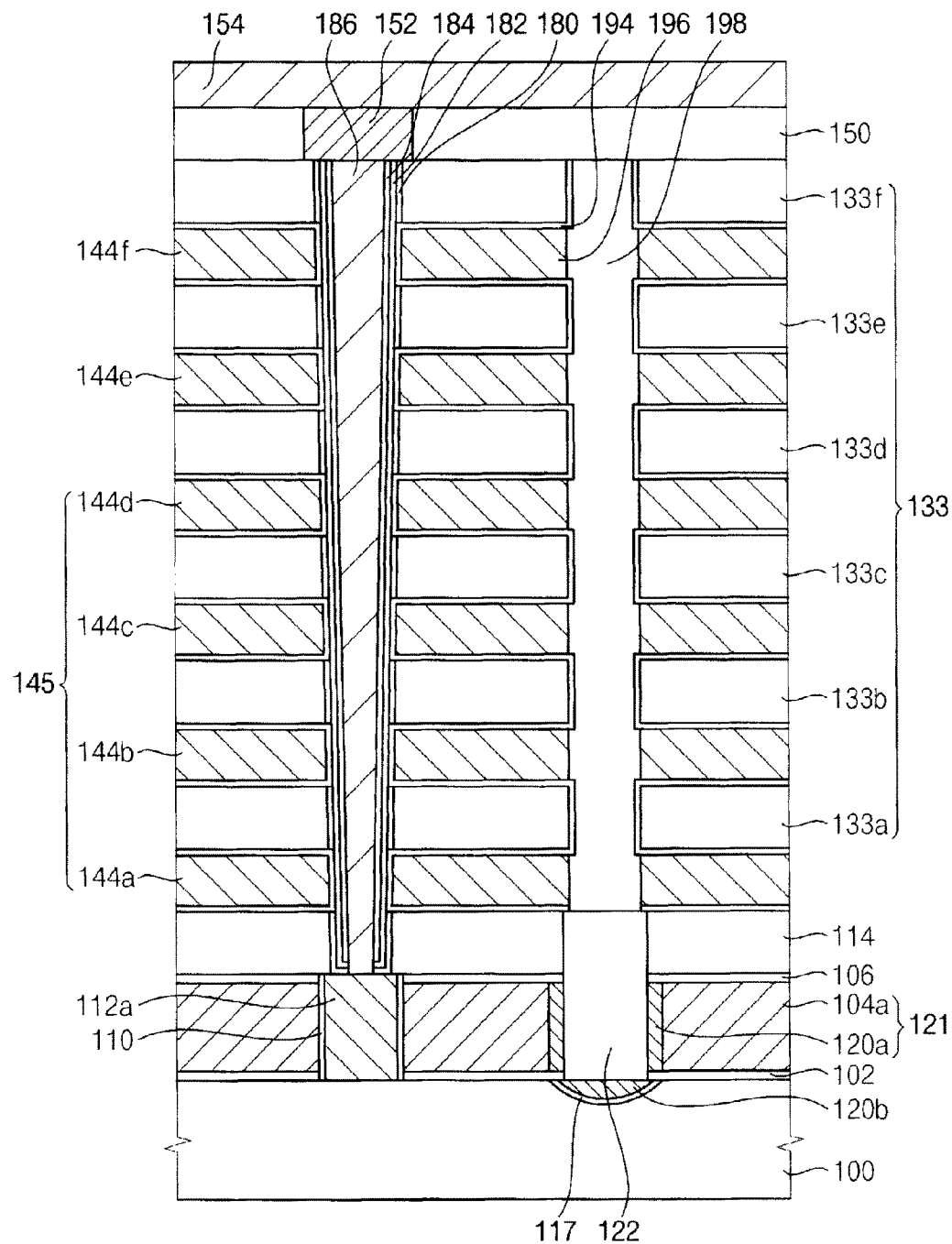
FIG. 8 is a schematic cross-sectional view illustrating a vertical semiconductor device, in accordance with exemplary embodiments of the inventive concept.

FIG. 8 is a schematic cross-sectional view illustrating a vertical semiconductor device in accordance with some exemplary embodiments of the inventive concept. The vertical semiconductor device in FIG. 8 may have a structure substantially the same as that illustrated in and described in detail with reference to FIG. 2A except for the shape of the tunnel insulation layer, the charge trapping layer and the blocking dielectric layer.

Referring to FIG. 8, the first semiconductor pattern 112*a* and the GSTs may be formed on the substrate 100 as shown in FIG. 2A. In some exemplary embodiments, the second semiconductor pattern 186 may have a solid cylindrical shape or a pillar shape or a tapered shape contacting a top surface of the first semiconductor pattern 112*a*.

In some exemplary embodiments, a tunnel insulation layer 184 may completely surround the second semiconductor pattern 186. A charge trapping layer 182 may be formed on the tunnel insulation layer 184.

Insulating interlayer patterns 133 may protrude or extend from the charge trapping layer 182. In some exemplary embodiments, the insulating interlayer patterns 133 may have a linear shape extending in the first direction. The insulating interlayer patterns 133 may be spaced apart from one another in the third direction to define grooves 192 (see FIG. 9D) therebetween.

A blocking dielectric layer 194 may be formed continuously on the charge trapping layer 183 exposed by the grooves 192 and surfaces of the insulating interlayer patterns 133.

Control gate electrodes 145 and second gate electrodes 144e and 144f filling the grooves 192 may be disposed on the blocking dielectric layer 194. In some exemplary embodiments, the control gate electrodes 145 and the second gate electrodes 144e and 144f may have a linear shape extending in the first direction and may at least partially surround the second semiconductor pattern 186.

A second insulation layer pattern 198 may be disposed between multi-stacked structures including the gate electrodes 145, 144e and 144f and the insulating interlayer patterns 133. In some exemplary embodiments, the second insulation layer pattern 198 may have a linear shape extending in the first direction.

An upper insulating interlayer 150, a bit line contact 152 and a bit line 154 may be formed in the same manner as illustrated in and described in detail with reference to FIG. 2A.

FIGS. 9A to 9D are schematic cross-sectional views illustrating a method of manufacturing the vertical semiconductor device of FIG. 8, according to some exemplary embodiments of the inventive concept. Referring to FIGS. 9A to 9D, sacrificial layers 130 and insulating interlayers 132 may be formed by performing steps and processes substantially the same as those illustrated in and described in detail with reference to FIGS. 3A to 3H.

Figure 9A:
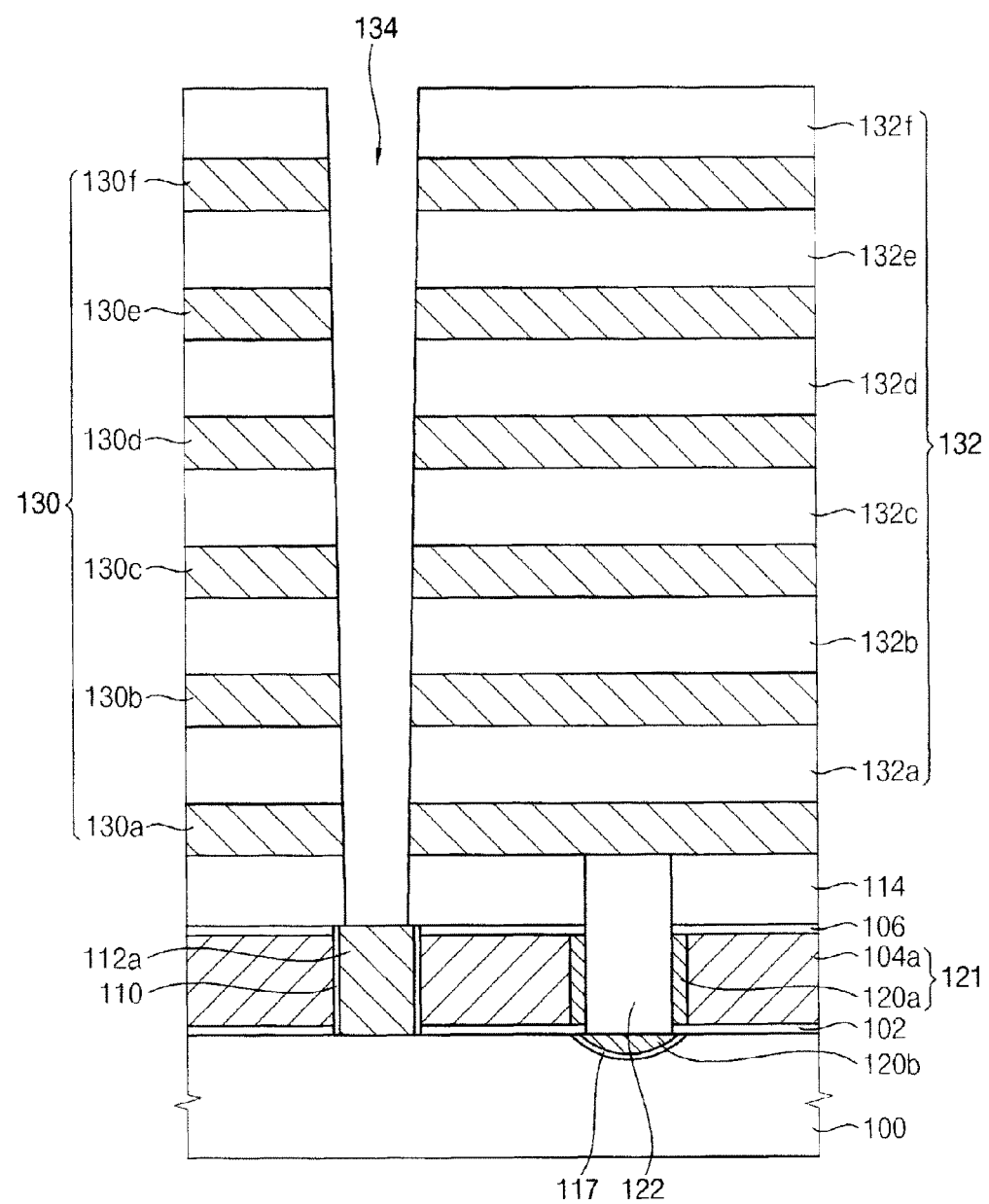
FIGS. 9A to 9D are schematic cross-sectional views illustrating a method of manufacturing the vertical semiconductor device of FIG. 8, in accordance with exemplary embodiments of the inventive concept.

Referring to FIG. 9A, the sacrificial layers 130 and the insulating interlayers 132 may be partially etched to form a third opening 134. The third opening 134 exposes a top surface of the first semiconductor pattern 112a.

Figure 9B:
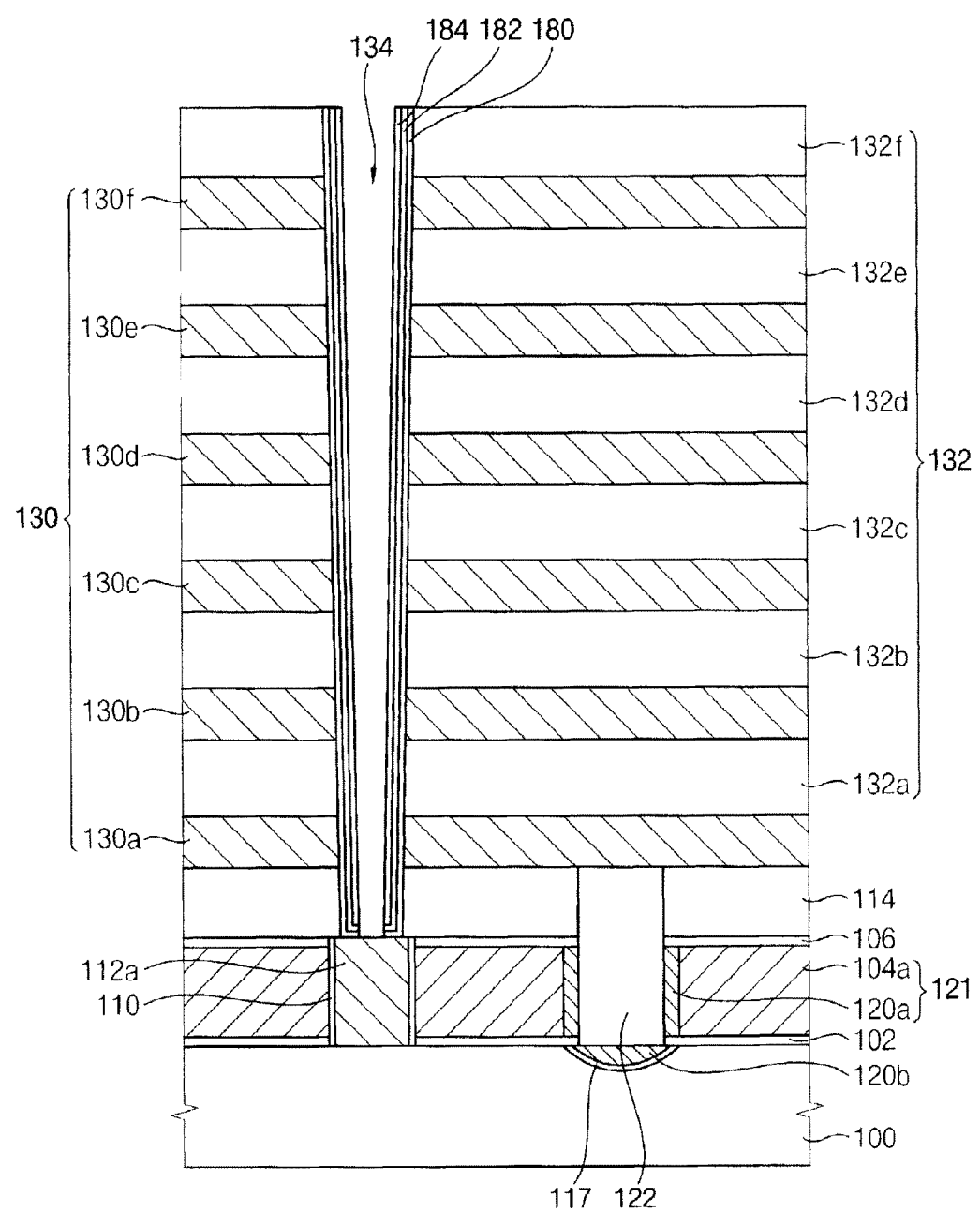

Referring to FIG. 9B, a preliminary blocking dielectric layer, a preliminary charge trapping layer and a preliminary tunnel insulation layer may be sequentially formed on sidewalls and a bottom of the third opening 134, that is, conformally on the third opening 134. Portions of the preliminary blocking dielectric layer, the preliminary charge trapping layer and the preliminary tunnel insulation layer formed on the bottom of the third opening 134 may be selectively removed to form a blocking dielectric layer 180, a charge trapping layer 182 and a tunnel insulation layer 184 sequentially on the sidewalls of the third opening 134. The top surface of the first semiconductor pattern 112a may be exposed by the third opening 134.

Figure 9C:
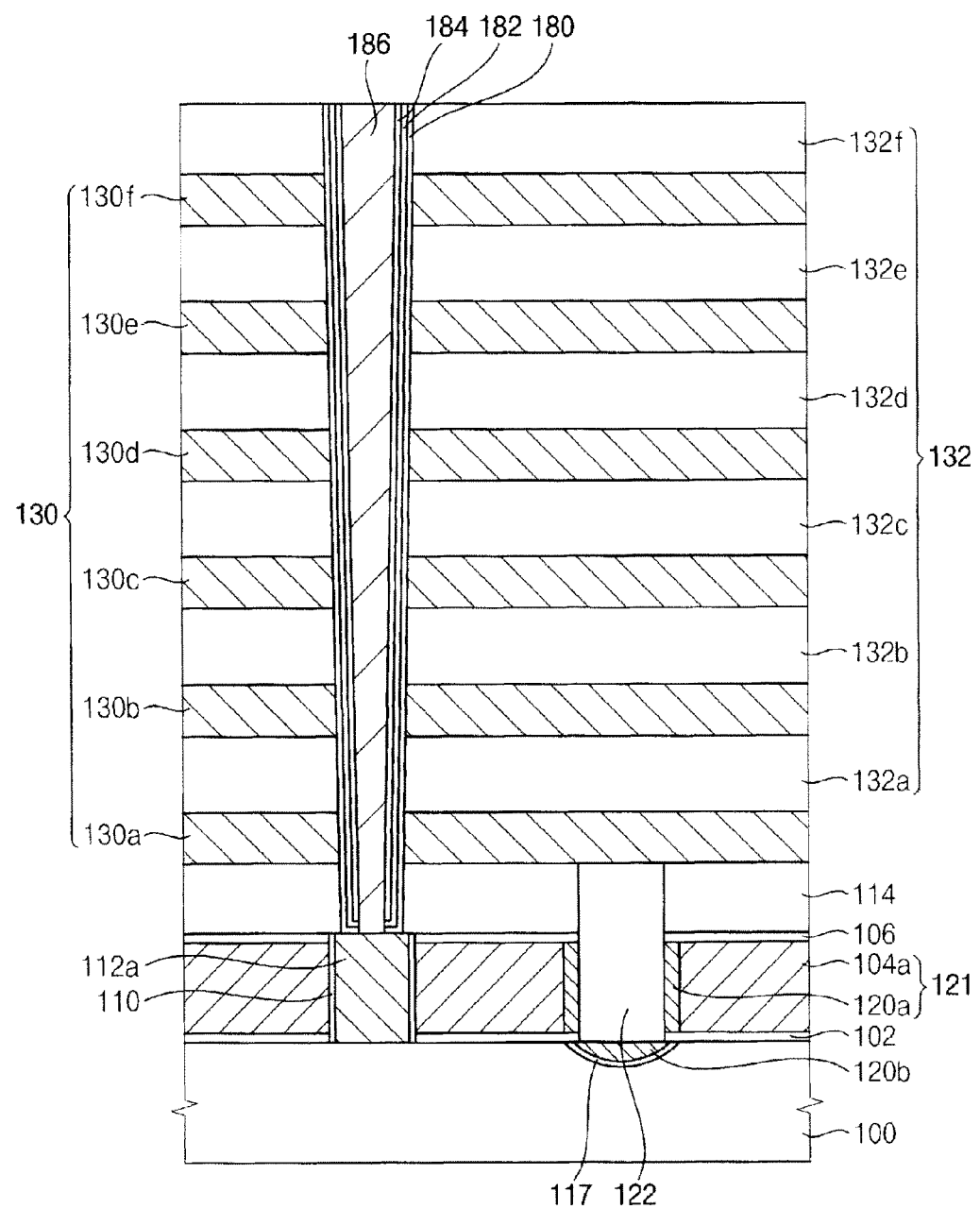

Referring to FIG. 9C, in some exemplary embodiments, a second semiconductor pattern 186 may be formed on the first semiconductor pattern 112a to fill the third opening 134. In some exemplary embodiments, the second semiconductor pattern 186 may make direct contact with the tunnel insulation layer 184.

For example, a polysilicon layer may be formed to completely fill the third opening 134. An upper portion of the polysilicon layer may be planarized to form the second semiconductor pattern 186 in the third opening 134.

Figure 9D:
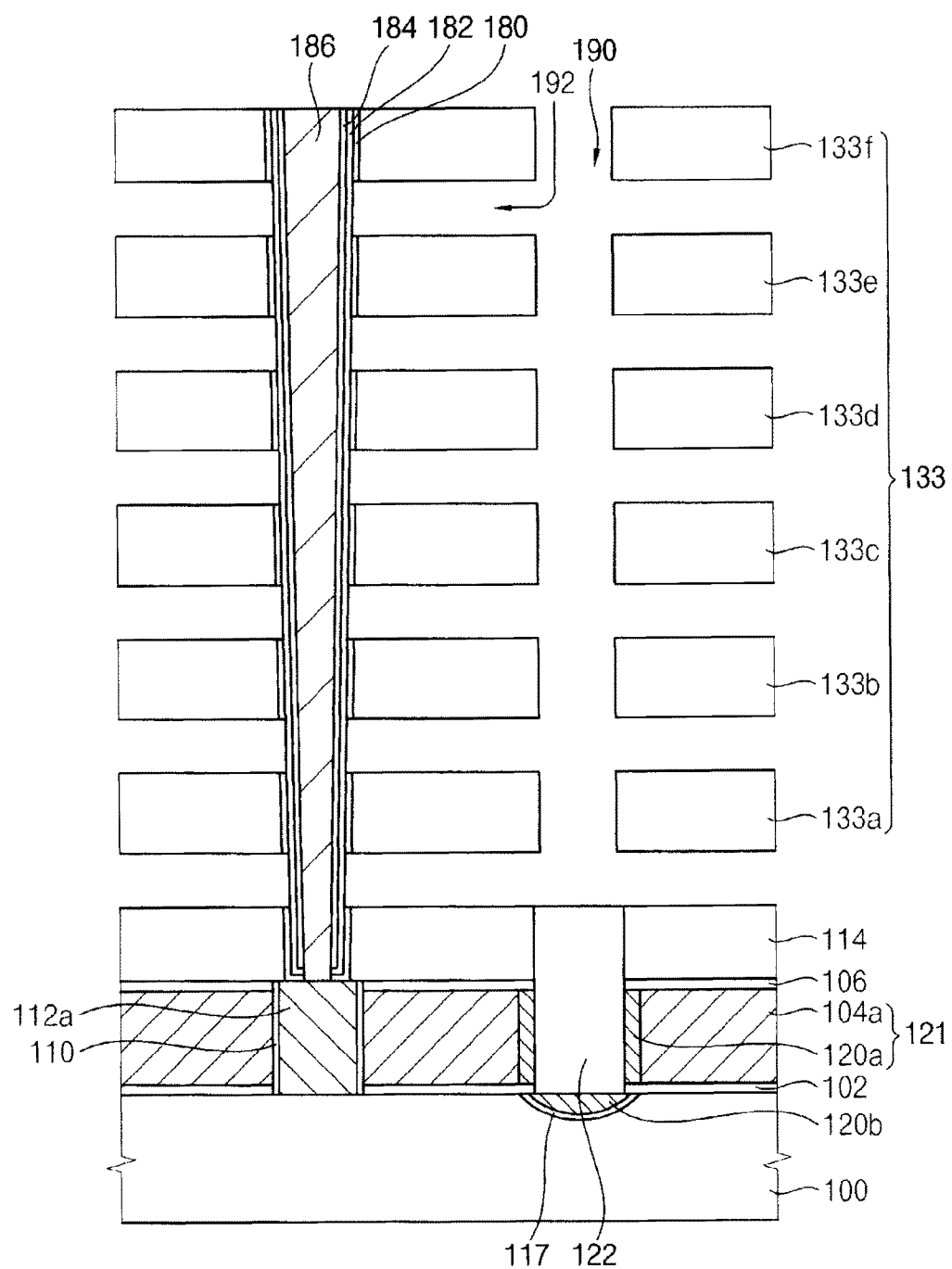

Referring to FIG. 9D, the insulating interlayers 132 and the sacrificial layers 130 between the second semiconductor patterns 186 may be partially etched to form a fourth opening 190. This results in formation of sacrificial layer patterns (not shown) and insulating interlayer patterns 133. The fourth opening 190 may extend in the first direction. In some exemplary embodiments, a top surface of the first insulation layer pattern 122 may be exposed by the fourth opening 190.

The sacrificial layer patterns exposed by sidewalls of the fourth opening 190 may be selectively removed to form grooves 192. In some exemplary embodiments, portions of the blocking dielectric layer 180 exposed by the grooves 192 may also be removed together with the sacrificial layer patterns, because the blocking layer 180 may have defects after deposition thereof.

In some exemplary embodiments, the sacrificial layer patterns and the blocking dielectric layer 180 may be removed by a wet etching process. In some exemplary embodiments, the sacrificial layer patterns and the blocking dielectric layer 180 may be removed using phosphoric acid. Thus, the insulating interlayer patterns 133 may be arranged on an outer sidewall of the second semiconductor pattern 186 and may be spaced apart from one another by a constant distance.

Referring to FIG. 8 again, in some exemplary embodiments, a blocking dielectric layer 194 may be formed continuously on the charge trapping layer exposed by the grooves 192 and surfaces of the insulating interlayer patterns 133. The blocking dielectric layer 194 may be formed using silicon oxide or a metal oxide such as aluminum oxide.

In such exemplary embodiments, the tunnel insulation layer 184 and the charge trapping layer 186 may completely surround the outer sidewall of the second semiconductor pattern 186. However, in some exemplary embodiments, the blocking dielectric layer 194 may have a different shape from that of the tunnel insulation layer 184 and the charge trapping layer 186.

Next, in some exemplary embodiments, a conductive layer may be formed on the blocking dielectric layer 194 to sufficiently fill the grooves 192. A portion of the conductive layer formed in the fourth opening 190 may be removed. A portion of the blocking dielectric layer 194 formed on the bottom of the fourth opening 190 may also be removed. The conductive layer and the blocking dielectric layer 194 may be selectively removed by a wet etching process.

By performing the above-described steps and processes, transistors including the SSTs and the cell transistors as described above in detail may be formed. Two uppermost of the transistors may serve as SSTs.

Continuing to refer again to FIG. 8 an upper insulating interlayer 150 may be formed on top surfaces of the second semiconductor pattern 186, the second insulation layer pattern 148 and an uppermost insulating interlayer pattern 133f. In some exemplary embodiments, a bit line contact 152 may be formed through the upper insulating interlayer 150 to be electrically connected to the second semiconductor pattern 186. A bit line 154 may be formed on the upper insulating interlayer 150 to contact the bit line contact 152.

Figure 10:
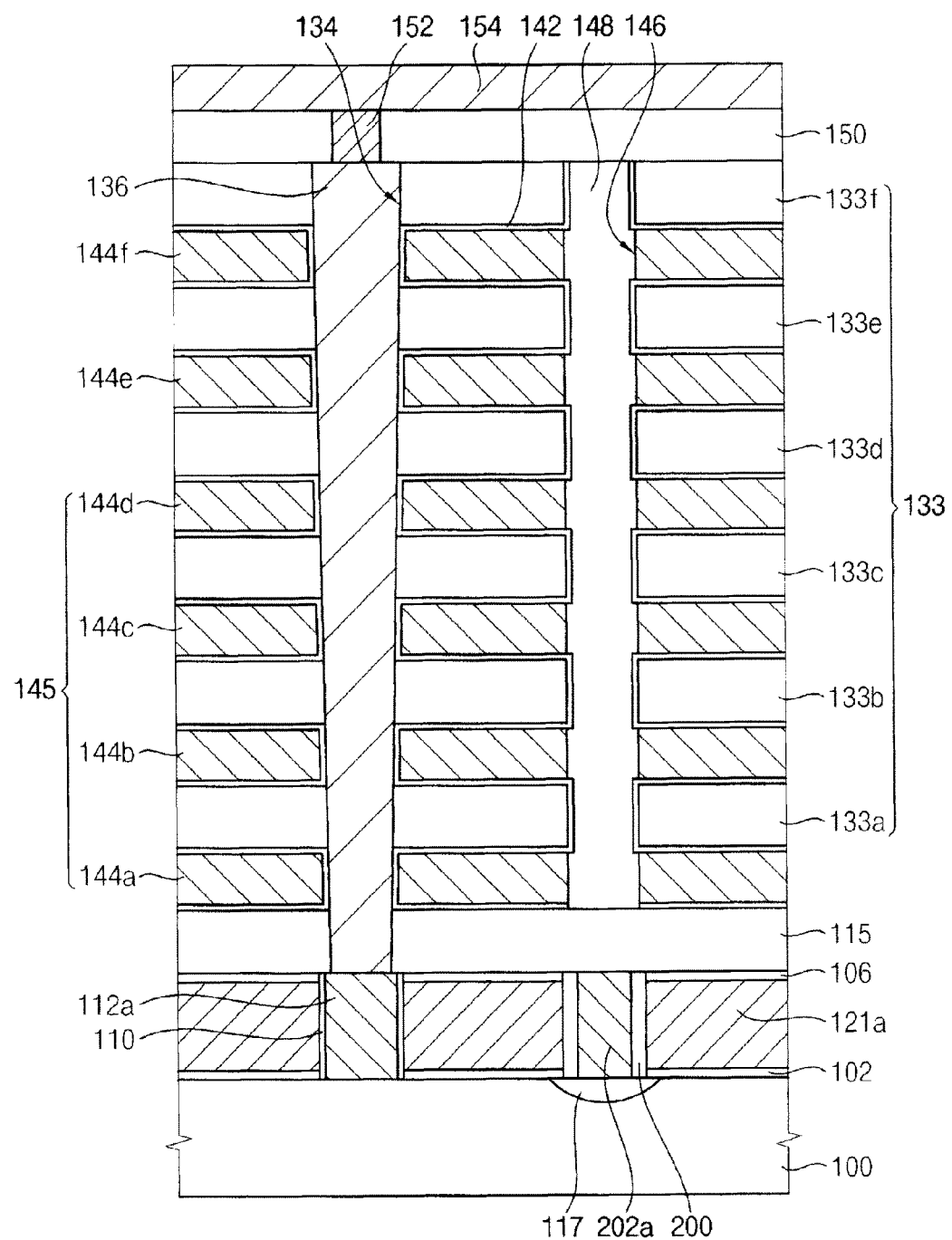
FIG. 10 is a schematic cross-sectional view illustrating a vertical semiconductor device, in accordance with exemplary embodiments of the inventive concept.

FIG. 10 is a schematic cross-sectional view illustrating a vertical semiconductor device in accordance with some exemplary embodiments of the inventive concept. The vertical semiconductor device in FIG. 10 may have a structure substantially the same as that illustrated in and described in detail in connection with FIG. 2A except for the shape of the common source line.

Referring to FIG. 10, the first semiconductor pattern 112a and the GST may be formed on the substrate 100 as shown in FIG. 2A. In some exemplary embodiments, a first gate electrode 121a of the GST may include, for example, polysilicon. In some exemplary embodiments, the first gate electrode 121a may not include a metal silicide.

In some exemplary embodiments, an insulation spacer 200 may be disposed on a sidewall of a second opening between the first gate electrodes 121a. The first gate electrode 121a and a CSL 202a may be insulated from each other by the insulation spacer 200. In some exemplary embodiments, a conductive pattern may be disposed on the insulation spacers 200 in the second opening to serve as the CSL 202a. In some exemplary embodiments, the CSL 202a may include, for example, polysilicon or metal.

As shown in FIG. 10, the CSL 202a may be disposed in the second opening and may have an increased height. As a result of this increased height, resistance of the common source line 202a may be reduced.

In some exemplary embodiments, a second lower insulating interlayer 115 may be formed on the first semiconductor pattern 112a, the first gate electrodes 121a, the insulation spacer 200 and the CSL 202a. A second semiconductor pattern 136 may be disposed on a top surface of the first semiconductor pattern 112a to protrude or extend from the first semiconductor pattern 112a through the second lower insulating interlayer 115 in the third direction. Cell transistors and SSTs may be provided on sidewalls of the second semiconductor pattern 136. In some exemplary embodiments, an upper insulating interlayer 150, a bit line contact 152 and a bit line 154 may be formed as described in detail with reference to FIG. 2A.

Figure 11A:
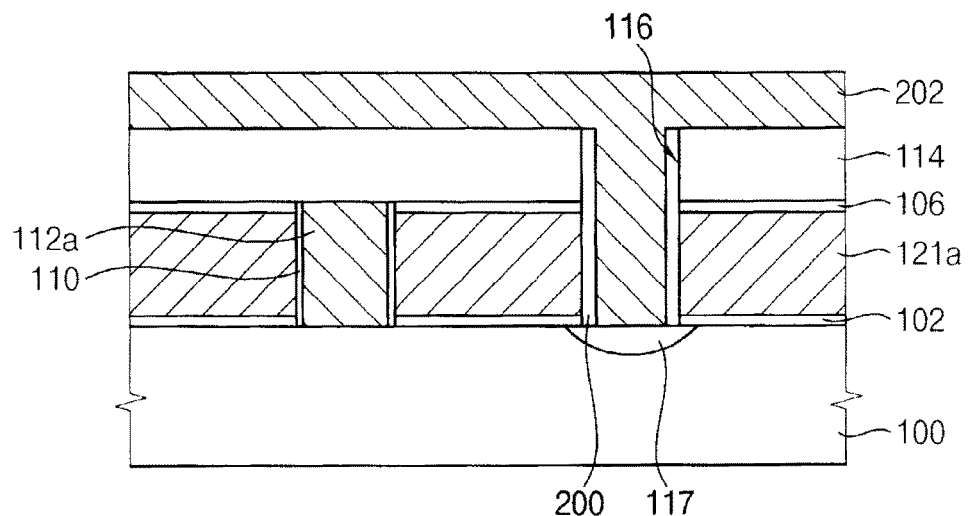
FIGS. 11A to 11C are schematic cross-sectional views illustrating a method of manufacturing the vertical semiconductor device of FIG. 10, in accordance with exemplary embodiments of the inventive concept.
Figure 11B:
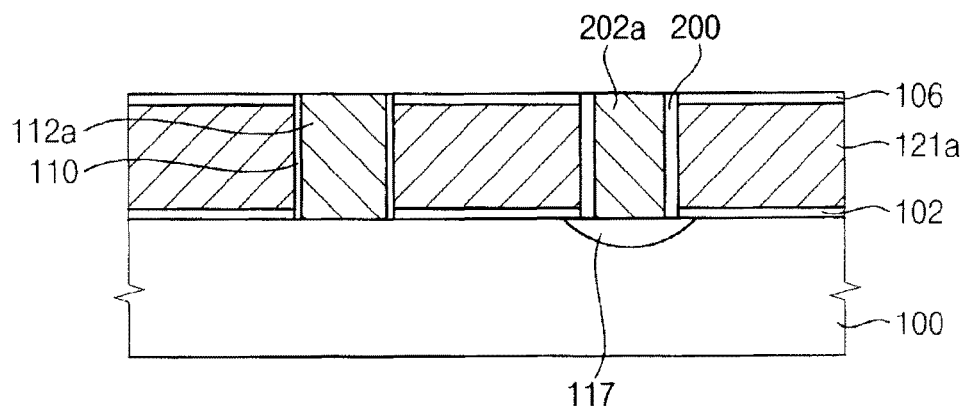
Figure 11C:
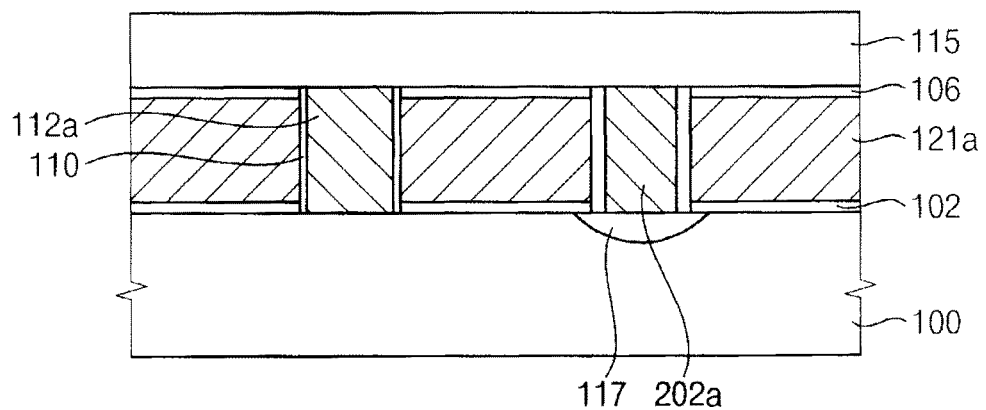

FIGS. 11A to 11C are schematic cross-sectional views illustrating a method of manufacturing the vertical semiconductor device of FIG. 10. The lower insulating interlayer 114 and the second opening 116 may be formed by performing steps and processes substantially the same as those illustrated in and described in detail in connection with FIGS. 3A to 3D.

Referring to FIG. 11A, an insulation layer may be formed on the lower insulating interlayer 114 and a sidewall and a bottom of the second opening 116, that is, conformally in the second opening 116. The insulation layer may be anisotropically etched to form an insulation spacer 200 on the sidewall of the second opening 116. Next, a conductive layer 202 may be formed on the lower insulating interlayer 114 to fill the second opening 116. In some exemplary embodiments, the conductive layer 202 may be formed using, for example, at least one of polysilicon, metal, metal silicide, or other similar material. These may be used alone or in a combination. Referring to FIG. 11B, an upper portion of the conductive layer 202 may be planarized until a top surface of a buffer layer 106 is exposed, thus forming a CSL 202a in the second opening 116. Referring to FIG. 11C, a second lower insulating interlayer 115 may be formed to cover the first semiconductor pattern 112a, the first gate electrodes 121a and the common source line 202a.

Next, steps and processes substantially the same as those illustrated in and described in detail with reference to FIGS. 3H to 3K may be performed on the second lower insulating interlayer 115 to achieve the memory device in FIG. 10.

In some exemplary embodiments, the CSL 202a may be formed in advance to forming a multi-stacked cell structure. Because the CSL 202a may be formed in advance to forming the multi-stacked structure, the CSL may be easily formed. Additionally, the GST may be formed in advance to forming the multi-stacked cell structure so that the number of layers that need to be etched in order to form openings may be reduced.

Figure 12:
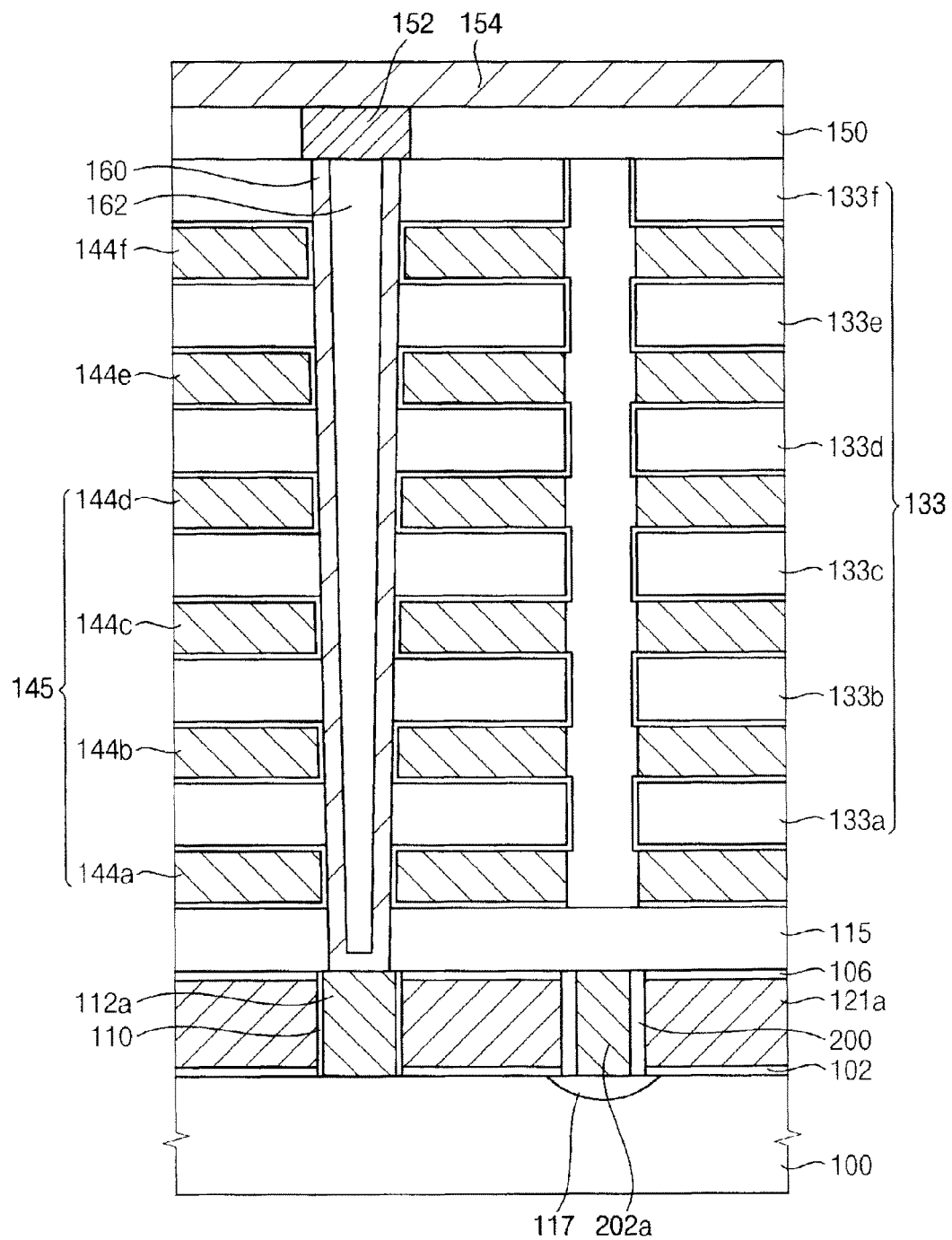
FIG. 12 is a schematic cross-sectional view illustrating a vertical semiconductor device, in accordance with exemplary embodiments of the inventive concept.

FIG. 12 is a schematic cross-sectional view illustrating a vertical semiconductor device in accordance with some exemplary embodiments of the inventive concept. The vertical semiconductor device in FIG. 12 may have a structure substantially the same as that illustrated in and described in detail in connection with FIG. 4 except for a shape of a common source line.

Referring to FIG. 12, the first semiconductor pattern 112a and the GST may be formed on the substrate 100 as shown in and described in detail with reference to FIG. 4. In some exemplary embodiments, a first gate electrode 121a of the GST may include polysilicon. In some exemplary embodiments, the first gate electrode 121a may not include a metal silicide.

An insulation spacer 200 may be disposed on a sidewall of a second opening between the first gate electrodes 121a. In some exemplary embodiments, a conductive pattern may be disposed on the insulation spacer 200 in the second opening to serve as a CSL 202a. A second lower insulating interlayer 115 may be formed on the first semiconductor pattern 112a, the first gate electrodes 121a, the insulation spacers 200 and the common source line 202a. A second semiconductor pattern 160 may be disposed on a top surface of the first semiconductor pattern 112a to protrude or extend from the first semiconductor pattern 112a through the second lower insulating interlayer 1158 in the third direction. In some exemplary embodiments, cell transistors and SSTs may be disposed on a sidewall of the second semiconductor pattern 160. In some exemplary embodiments, an upper insulating interlayer 150, a bit line contact 152 and a bit line 154 may be formed as illustrated in and described in detail with reference to FIG. 4.

A method of manufacturing the memory device illustrated in FIG. 12 is described herein in detail. In some exemplary embodiments, the first semiconductor pattern 112a, the first gate electrodes 121a, the common source line 202a and the second lower insulating interlayer 115 may be formed by performing steps and processes substantially the same as those illustrated in and described in detail with reference to FIGS. 11A to 11C. Next, steps and processes substantially the same as those illustrated in and described in detail with reference to FIG. 5 may be performed to achieve the memory device in FIG. 12.

Figure 13:
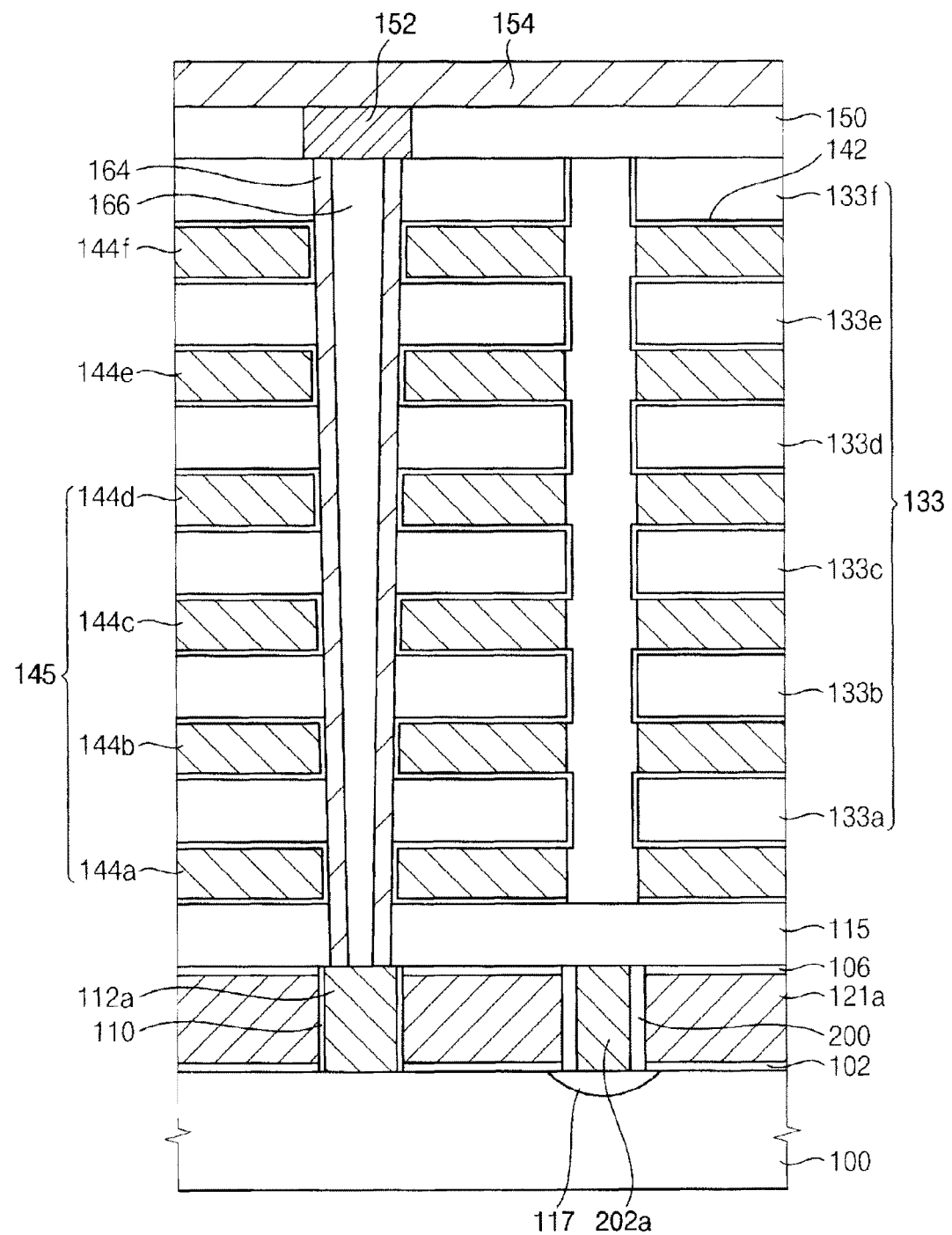
FIG. 13 is a schematic cross-sectional view illustrating a vertical semiconductor device, in accordance with exemplary embodiments of the inventive concept.

FIG. 13 is a schematic cross-sectional view illustrating a vertical semiconductor device in accordance with some exemplary embodiments of the inventive concept. The vertical semiconductor device in FIG. 13 may have a structure substantially the same as that illustrated in and described in detail with reference to FIGS. 6A and 6B except for the shape of a common source line.

Referring to FIG. 13, the first semiconductor pattern 112a and the GST may be provided as shown in and described in detail with reference to FIG. 6A. In some exemplary embodiments, a first gate electrode 121a may include polysilicon. In some exemplary embodiments, the first gate electrode 121a may not include a metal silicide. Insulation spacers 200 may be provided on sidewalls of a second opening between the first gate electrodes 121a. A conductive pattern may be disposed the insulation spacers 200 in the second opening to serve as a CSL 202a. A second lower insulating interlayer 115 may formed on the first semiconductor pattern 112a, the first gate electrodes 121a, the insulation spacers 200 and the common source line 202a. A second semiconductor pattern 166 may be disposed on a top surface of the first semiconductor pattern 112a to protrude or extend from the first semiconductor pattern 112a through the second lower insulating interlayer 115 in the third direction. Cell transistors and SSTs may be disposed on a sidewall of the second semiconductor pattern 166. An upper insulating interlayer 150, a bit line contact 152 and a bit line 154 may be formed as illustrated in and described in detail with reference to FIG. 6A.

A method of manufacturing vertical semiconductor device illustrated in FIG. 13 will be described in detail herein. In some exemplary embodiments, the first semiconductor pattern 112a, the first gate electrodes 121a, the common source line 202a and the second lower insulating interlayer 115 may be formed by performing steps and processes substantially the same as those illustrated in and described in detail with reference to FIGS. 11A to 11C. Next, steps and processes substantially the same as those illustrated in and described in detail with reference to FIG. 7A to 7D may be performed to achieve the memory device in FIG. 13.

Figure 14:
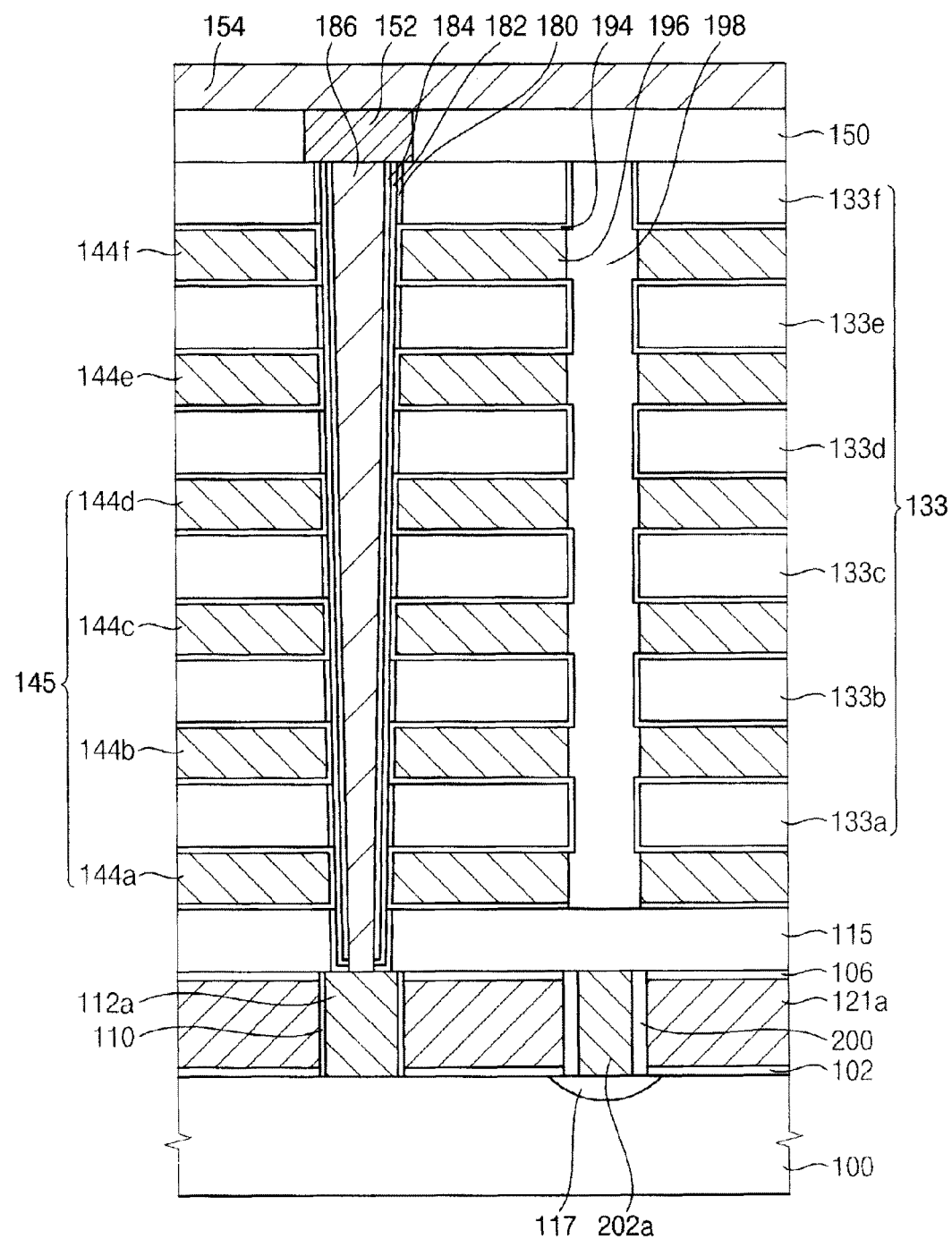
FIG. 14 is a schematic cross-sectional view illustrating a vertical semiconductor device, in accordance with exemplary embodiments of the inventive concept.

FIG. 14 is a schematic cross-sectional view illustrating a vertical semiconductor device in accordance with some exemplary embodiments of the inventive concept. The vertical semiconductor device in FIG. 14 may have a structure substantially the same as that illustrated in and described in detail with reference to FIG. 8 except for a shape of a common source line.

Referring to FIG. 14, the first semiconductor pattern 112a and the GST may be formed as illustrated in and described in detail in connection with FIG. 8. An insulation spacer 200 may be formed on a sidewall of a second opening between first gate electrodes 121a. A conductive pattern may be disposed on the insulation spacer 200 in the second opening to serve as a CSL 202a.

A second lower insulating interlayer 115 may be formed on the first semiconductor pattern 112a, the first gate electrodes 121a, the insulation spacer 200 and the CSL 202a. A second semiconductor pattern 186 may be disposed on a top surface of the first semiconductor pattern 112a to protrude or extend from the first semiconductor pattern 112a through the second lower insulating interlayer 115 in the third direction. Cell transistors and SSTs may be disposed on a sidewall of the second semiconductor pattern 186. An upper insulating interlayer 150, a bit line contact 152 and a bit line 154 may be formed as illustrated in and described in detail with reference to FIG. 8.

A method of manufacturing the memory device illustrated in FIG. 14 will be described in detail herein. The first semiconductor pattern 112a, the first gate electrodes 121a, the common source line 202a and the second lower insulating interlayer 115 may be formed by performing steps and processes substantially the same as those illustrated in and described in detail with reference to FIGS. 11A to 11C. Next, the steps and processes substantially the same as those illustrated in and described in detail with reference to FIG. 9A to 9D may be performed to achieve the memory device in FIG. 14.

Figure 15:
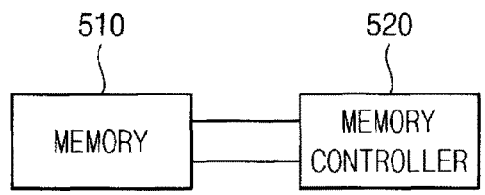
FIG. 15 is a schematic block diagram illustrating a memory card including a vertical semiconductor device, in accordance with exemplary embodiments of the inventive concept.

FIG. 15 contains a schematic block diagram which illustrates a memory card including the vertical semiconductor device in accordance with exemplary embodiments of the inventive concept described herein in detail.

Referring to FIG. 15, the memory card may include a memory 510 connected to a memory controller 520. The memory 510 may include any of the vertical semiconductor devices described herein in detail according to exemplary embodiments. The memory controller 520 may supply signals for controlling the operation of the memory 510. The memory 510 may be provided for storing data.

Figure 16:
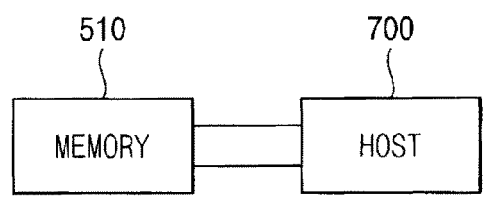
FIG. 16 is a schematic block diagram illustrating a system including a vertical semiconductor device, in accordance with exemplary embodiments of the inventive concept.

FIG. 16 contains a schematic block diagram which illustrates a system including the vertical semiconductor device in accordance with exemplary embodiments of the inventive concept described herein in detail.

Referring to FIG. 16, the system may include a memory 510 connected to a host 700. The memory 510 may include any of the vertical semiconductor devices described herein in detail according to exemplary embodiments. The host 700 may supply signals for controlling the operation of the memory 510. The memory 510 may be provided for storing data.

Figure 17:
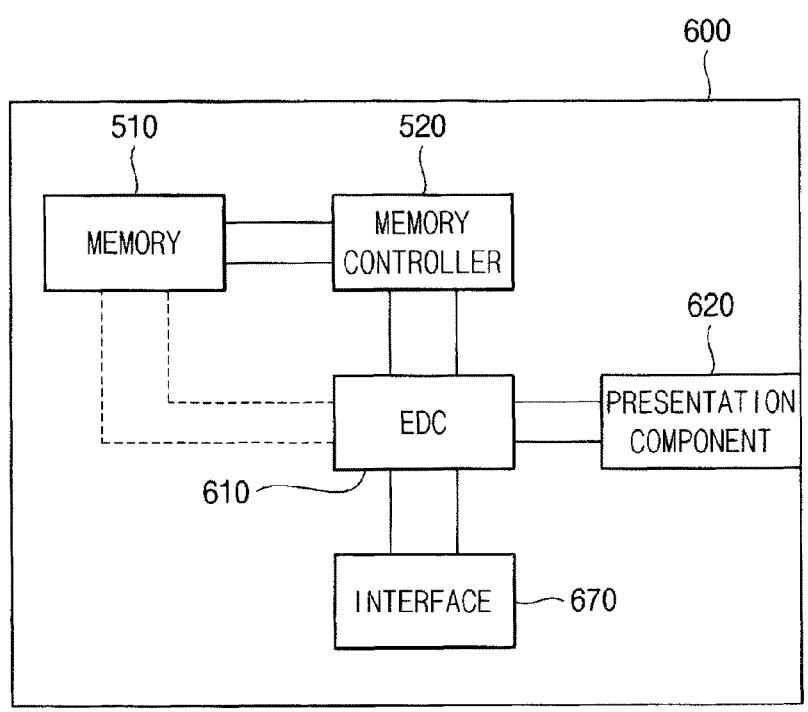
FIG. 17 is a schematic block diagram illustrating a portable device including a vertical semiconductor device, in accordance with exemplary embodiments of the inventive concept.

FIG. 17 contains a schematic block diagram which illustrates a portable device including the vertical semiconductor device in accordance with exemplary embodiments of the inventive concept described herein in detail. The portable device 600 may be an MP3 player, video player, combination video and audio player, or other such device. As illustrated, the portable device 600 may include the memory 510 and memory controller 520. The memory 510 may include any of the vertical semiconductor devices described herein in detail according to exemplary embodiments. The portable device 600 may also include an encoder/decoder EDC 610, a presentation component 620 and an interface 670. Data (video, audio, etc.) is input to and output from the memory 510 via the memory controller 520 by the EDC 610.

The foregoing detailed description is descriptive of exemplary embodiments and is not to be construed as limiting thereof. Although exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:

1. A vertical semiconductor device, comprising:
a substrate;
a first semiconductor pattern on the substrate;
a first gate structure on a sidewall of the first semiconductor pattern;
a second semiconductor pattern on the first semiconductor pattern;
a plurality of insulating interlayer patterns on sidewalls of the second semiconductor pattern, the insulating interlayer patterns being spaced apart to define grooves between the insulating interlayer patterns; and
a plurality of second gate structures disposed in the grooves, respectively,
wherein each of the second gate structures includes a tunnel insulation layer, a charge trapping layer, a blocking dielectric layer and a second conductive layer pattern which are sequentially stacked, and
wherein the second gate structures serve as word lines of cell transistors and string selection lines (SSLs) of string selection transistors (SSTs).

2. The vertical semiconductor device of claim 1, wherein the first gate structure comprises a first conductive material, the plurality of second gate structures includes a second conductive material, and the first and second conductive materials are different materials.

3. The vertical semiconductor device of claim 1, wherein the first gate structure has a height that is different from a height of at least one of the second gate structures.

4. The vertical semiconductor device of claim 1, wherein the first gate structure includes a gate insulation layer and a first conductive layer pattern which are sequentially stacked, and the first gate structure serves as a ground selection line (GSL).

5. The vertical semiconductor device of claim 4, wherein the first conductive layer pattern includes polysilicon.

6. The vertical semiconductor device of claim 1, wherein:
the SSTs are disposed over the cell transistors and include at least two transistors.

7. The vertical semiconductor device of claim 6, wherein the second conductive layer pattern includes a metal.

8. The vertical semiconductor device of claim 1, further comprising an impurity region disposed at an upper portion of the substrate between a plurality of the first gate structures, the impurity region serving as a common source line (CSL).

9. The vertical semiconductor device of claim 8, further comprising at least one of a metal silicide pattern and a metal layer on the impurity region.

10. A vertical semiconductor device, comprising:
a first semiconductor pattern on a substrate;

a first gate structure disposed on a sidewall of the first semiconductor pattern, the first gate structure including a gate insulation layer and a first conductive layer pattern which are sequentially stacked, the first gate structure serving as a ground selection line (GSL);

a second semiconductor pattern disposed on the first semiconductor pattern;

a plurality of insulating interlayer patterns disposed on sidewalls of the second semiconductor pattern, the insulating interlayer patterns being spaced apart to define grooves between the insulating interlayer patterns;

a plurality of second gate structures disposed in the grooves, respectively, each of the second gate structures including a tunnel insulation layer, a charge trapping layer, a blocking dielectric layer and a second conductive layer pattern which are sequentially stacked, the second gate structures serving as word lines of cell transistors and string selection lines (SSLs) of string selection transistors (SSTs), the SSTs being disposed over the cell transistors and including at least two transistors; and an impurity region disposed at an upper portion of the substrate, the impurity region serving as a common source line (CSL).

11. The vertical semiconductor device of claim 10, wherein the first gate structure has a different height from that of the second gate structures.

12. The vertical semiconductor device of claim 10, wherein a conductive material of the first gate structure is different from that of the second gate structures.

13. The vertical semiconductor device of claim 10, wherein the first conductive layer pattern comprises polysilicon.

14. The vertical semiconductor device of claim 10, wherein the second conductive layer pattern comprises a metal.

15. The vertical semiconductor device of claim 10, further comprising a conductive material layer formed on the impurity region.

* * * * *